United States Patent
Hashimoto et al.

(10) Patent No.: US 6,777,279 B2
(45) Date of Patent: Aug. 17, 2004

(54) SEMICONDUCTOR INTEGRATED CIRCUIT DEVICE AND MANUFACTURING METHOD THEREOF

(75) Inventors: Chiemi Hashimoto, Koganei (JP); Yasuhiko Kawashima, Kodaira (JP); Keizo Kawakita, Tokyo (JP); Masahiro Moniwa, Sayama (JP); Hiroyasu Ishizuka, Ome (JP); Akihiro Shimizu, Hitachinaka (JP)

(73) Assignees: Renesas Technology Corp., Tokyo (JP); Hitachi ULSI Systems Co., Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/412,230

(22) Filed: Apr. 14, 2003

(65) Prior Publication Data

US 2003/0197202 A1 Oct. 23, 2003

(30) Foreign Application Priority Data

Apr. 12, 2002 (JP) ........................................ 2002-110628

(51) Int. Cl.$^7$ ........................................... H01L 21/336
(52) U.S. Cl. ..................... 438/197; 438/151; 438/199; 438/201; 438/206; 438/209; 438/275; 438/279; 438/585; 257/288; 257/350; 257/369
(58) Field of Search ................................. 438/151, 197, 438/199, 201, 206, 209, 275, 279, 585; 257/260, 262, 288, 296, 300, 327, 328, 350, 360, 367, 368, 369, 392, 393

(56) References Cited

U.S. PATENT DOCUMENTS 6,165,825 A * 12/2000 Odake ........................ 438/217
6,673,705 B2 * 1/2004 Miyashita ................... 438/585

FOREIGN PATENT DOCUMENTS

JP          2000-188338          7/2000        ....... H01L/21/8234

* cited by examiner

Primary Examiner—David Nelms
Assistant Examiner—Andy Huynh
(74) Attorney, Agent, or Firm—Antonelli, Terry, Stout & Kraus, LLP

(57) ABSTRACT

Disclosed are a semiconductor integrated circuit device and a method of manufacturing the same capable of realizing the two-level gate insulator process for the DRAM without increasing the number of manufacturing steps and that of photomasks. After forming a gate electrode of a MISFET which constitutes a memory cell in a memory array region on a semiconductor substrate, the substrate is subjected to thermal treatment (re-oxidation process). At this time, since bird's beak of the thick gate insulating film formed below the sidewall portion of the gate electrode penetrates into the center of the gate electrode, a gate insulating film thicker than the gate insulating film before the re-oxidation process is formed just below the center of the gate electrode. Meanwhile, since the gate electrode in the peripheral circuit region has a gate length longer than that of the gate electrode in the memory array region, the thickness of the gate insulating film just below the center thereof is almost equal to that before the re-oxidation process.

7 Claims, 26 Drawing Sheets

|  | A | B | C | D | E |
|---|---|---|---|---|---|
| tox-a | 7 | 10 | 13 | 7 | 10 |
| tox-b | 7 | 10 | 13 | 9.4 | 12.4 |

(nm)

SEMICONDUCTOR INTEGRATED CIRCUIT DEVICE AND MANUFACTURING METHOD THEREOF

TECHNICAL FIELD OF THE INVENTION

The present invention relates to a semiconductor integrated circuit device and a manufacturing technology of the same. More particularly, the present invention relates to a technique effectively applied to a semiconductor integrated circuit device having a DRAM (Dynamic Random Access Memory).

BACKGROUND OF THE INVENTION

In the field of the semiconductor device, the number of power supplies mounted on one semiconductor chip has been increased in recent years. Therefore, a so-called two-level gate insulator process has been put into practical use, in which a gate insulating film with a small thickness and a gate insulating film with a large thickness are respectively formed on the same surface of a semiconductor chip.

In the standard process for the two-level gate insulator, a semiconductor substrate made of single crystal silicon (hereinafter, simply referred to as substrate) is first subjected to the wet oxidation to form a silicon oxide film on the surface thereof. Subsequently, the insulating film in a region where a thick gate insulating film is to be formed (first region) is covered with a photoresist film, and the insulating film in a region where a thin gate insulating film is to be formed (second region) is removed by the etching. By so doing, the substrate surface in the second region is exposed.

Next, after the removal of the photoresist film, the substrate is subjected to the wet oxidation again, thereby forming a thin gate insulating film on the substrate surface in the second region. At this time, since the insulating film in the first region is also grown and the thickness thereof is increased, a thick gate insulating film is formed in the first region.

Also, the two-level gate insulator process is disclosed in the gazette of Japanese Patent Application Laid-Open No. 2000-188338, in which a gate insulating film made of silicon oxide and a gate insulating film made of silicon nitride are respectively formed in the first region and the second region of a substrate.

In the process described in the gazette, a first silicon oxide film is formed on the substrate in the first and second regions. Thereafter, the first silicon oxide film in the first region is selectively removed by the etching to expose a semiconductor substrate surface in the first region. Next, after forming a silicon nitride film on the substrate in the first region and on the first silicon oxide film in the second region, the silicon nitride film and the first silicon oxide film in the second region are selectively removed to expose the substrate surface in the second region. Subsequently, the substrate is subjected to thermal oxidation to form a second silicon oxide film on the substrate surface in the second region. In this manner, a first gate insulating film made of silicon nitride is formed on the substrate surface in the first region, and a second gate insulating film made of silicon oxide is formed on the semiconductor substrate surface in the second region.

SUMMARY OF THE INVENTION

In the ongoing development for higher capacity DRAM, the reduction of the gate length and that of the pitch between gate electrodes in the MISFET (Metal Insulator Semiconductor Field Effect Transistor) that constitutes the memory cell have been carried out in order to achieve the scaling of the memory cell to the smaller size.

However, the simple reduction of the gate length in the MISFET that constitutes the memory cell causes the reduction of the threshold voltage, and resulting in the reduction of the operational reliability of the memory cell. Therefore, the method that the impurity concentration in the channel region is set high is commonly used as a method to keep the threshold voltage at a predetermined level or higher even if the gate length is reduced.

However, if the channel impurity concentration in the MISFET that constitutes the memory cell is increased, the field intensity at the interface between the source/drain region and the channel region is increased, and the leakage current at this interface is increased. Consequently, another problem that the refresh characteristics are reduced is caused.

Also, the method of forming the gate insulating film to have a large thickness is available as a method to keep the threshold voltage at a predetermined level or higher while keeping the channel impurity concentration of the MISFET that constitutes the memory cell at a low level. However, on the other hand, since it is necessary to reduce the thickness of the gate insulating film in proportion to the scaling of the MISFET in order to achieve the high performance and the low voltage operation of the MISFET, the gate insulating film of the MISFET that constitutes the peripheral circuit is needed to be thinner than the gate insulating film of the MISFET that constitutes the memory cell.

As described above, the introduction of the two-level gate insulator process has become inevitable also in the manufacture of a DRAM. However, in the conventional two-level gate insulator process in which the two kinds of gate insulating films each having different thicknesses are formed on the same substrate, the number of photomasks and that of manufacturing steps are increased. Therefore, if the two-level gate insulator process is introduced in the manufacturing process of the DRAM, the increase in the manufacturing cost of the DRAM is caused.

An object of the present invention is to provide a technique capable of realizing the two-level gate insulator process in the manufacture of the DRAM without increasing the number of manufacturing steps and that of the photomasks.

The above and other objects and novel characteristics of the present invention will be apparent from the description and the accompanying drawings of this specification.

The typical ones of the inventions disclosed in this application will be briefly described as follows.

An aspect of the present invention is a semiconductor integrated circuit device, in which a plurality of first MISFETs each having a first gate electrode is formed in a first region of a main surface of a semiconductor substrate and a plurality of second MISFETs each having a second gate electrode is formed in a second region of the main surface of the semiconductor substrate, the second gate electrode having a gate length longer than that of the first gate electrode, wherein thickness of a gate insulating film formed just below a center of the first gate electrode is larger than that of the gate insulating film formed just below a center of the second gate electrode, and wherein thickness of a gate insulating film formed just below a sidewall portion of the first gate electrode is equal to that of the gate insulating film formed just below a sidewall portion of the second gate electrode.

Another aspect of the present invention is a method of manufacturing a semiconductor integrated circuit device, which comprises the steps of:
(a) forming a gate insulating film in first and second regions of a main surface of a semiconductor substrate;
(b) forming a conductive film on the gate insulating film;
(c) etching the conductive film to form a first gate electrode on the gate insulating film in the first region and a second gate electrode on the gate insulating film in the second region, the second gate electrode having a gate length longer than that of the first gate electrode;
(d) performing thermal treatment to the semiconductor substrate to make the gate insulating film formed just below the center of the first gate electrode thicker than the gate insulating film formed just below the center of the second gate electrode; and
(e) after the step (d), forming a first MISFET having the first gate electrode in the first region and forming a second MISFET having the second gate electrode in the second region.

Another aspect of the present invention is a method of manufacturing a semiconductor integrated circuit device, wherein a first gate electrode with a short gate length and a second gate electrode with a long gate length-are formed on a semiconductor substrate via a gate insulating film with a uniform thickness, and at the same time with the oxidation process to the semiconductor substrate in order to increase the thickness of the gate insulating film located at the edge portions of the first and second gate electrodes, the thickness of the gate insulating film located at the center of the first gate electrode is increased to be larger than that of the gate insulating film located at the center of the second gate electrode by taking advantage of the short gate length of the first gate electrode.

In this manner, it is possible to easily provide the two kinds of MISFETs having gate insulating films with different thicknesses without complicated manufacturing process. In addition, it is also possible to provide the MISFET having high threshold voltage without increasing the substrate concentration.

BRIEF DESCRIPTIONS OF THE DRAWINGS

Figure 25:
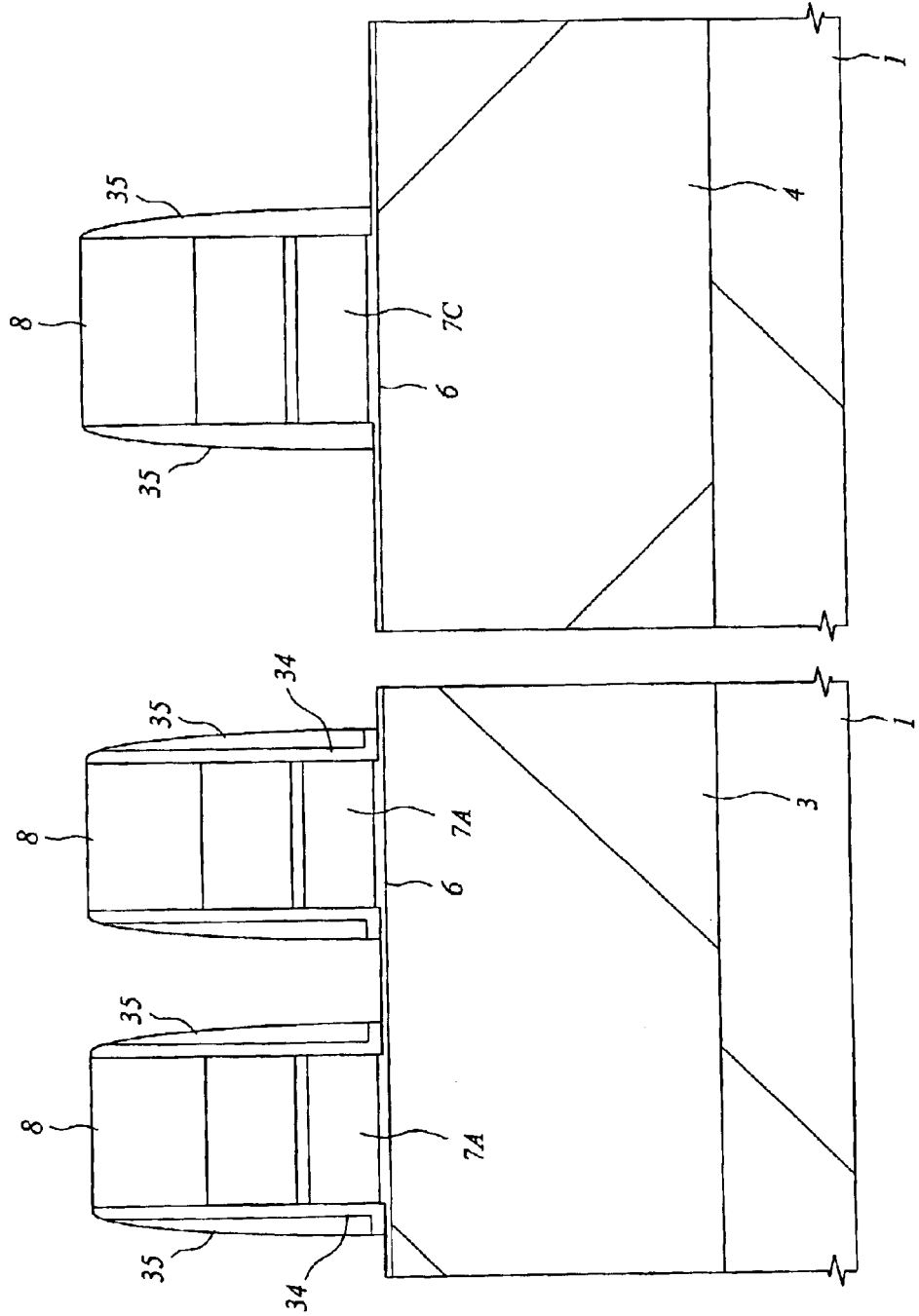
Figure 26:
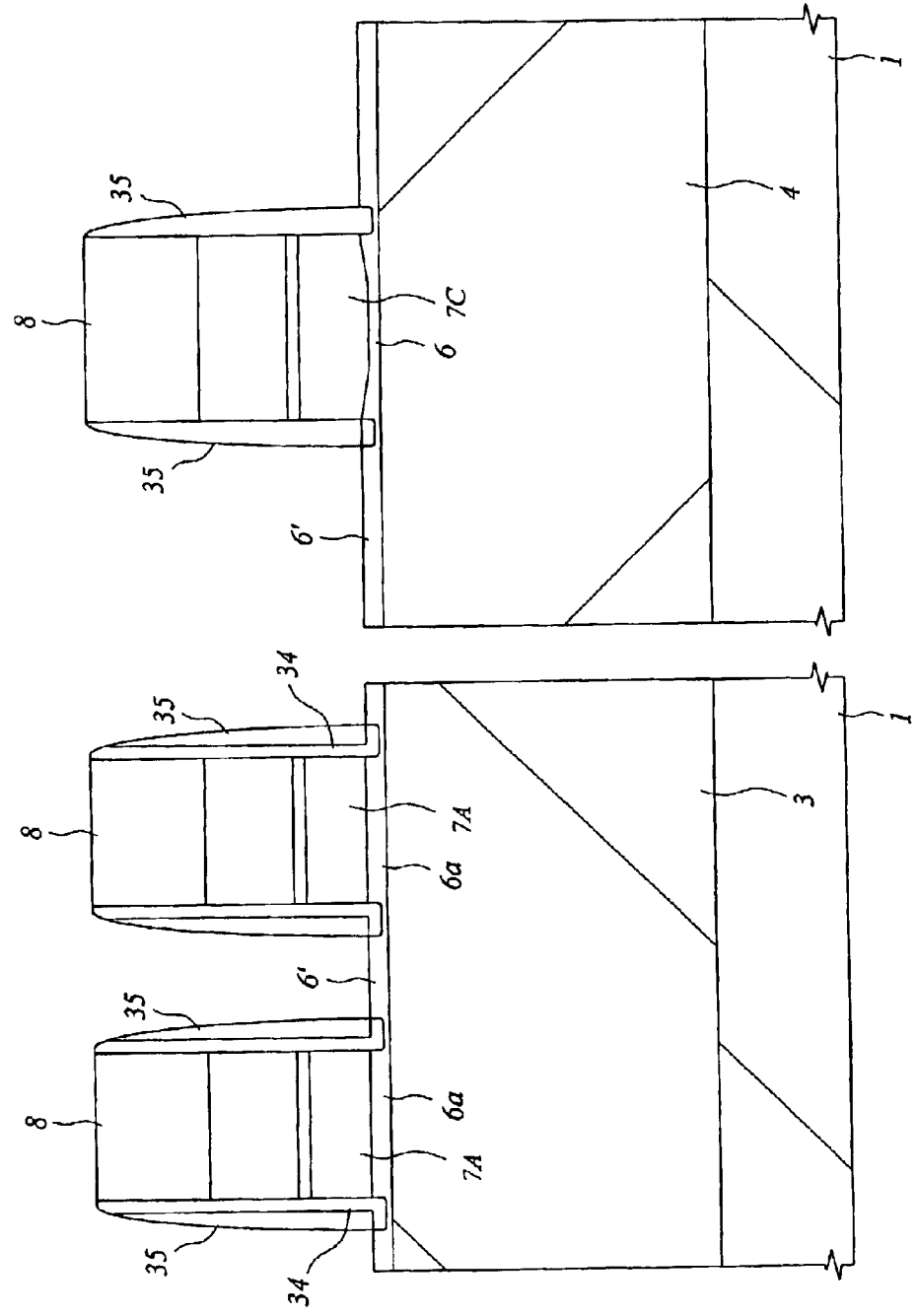

FIG. 25 is an enlarged sectional view showing the principal part of a semiconductor substrate that illustrates the manufacturing method of the DRAM according to another embodiment of the present invention; and FIG. 26 is an enlarged sectional view showing the principal part of a semiconductor substrate that illustrates the manufacturing method of the DRAM according to another embodiment of the present invention.

DESCRIPTION OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof is omitted.

First Embodiment

The first embodiment is a semiconductor integrated circuit device applied to, for example, a DRAM with a memory capacity of 256 Mbit (megabit), and the manufacturing process thereof is as follows.

Figure 1:
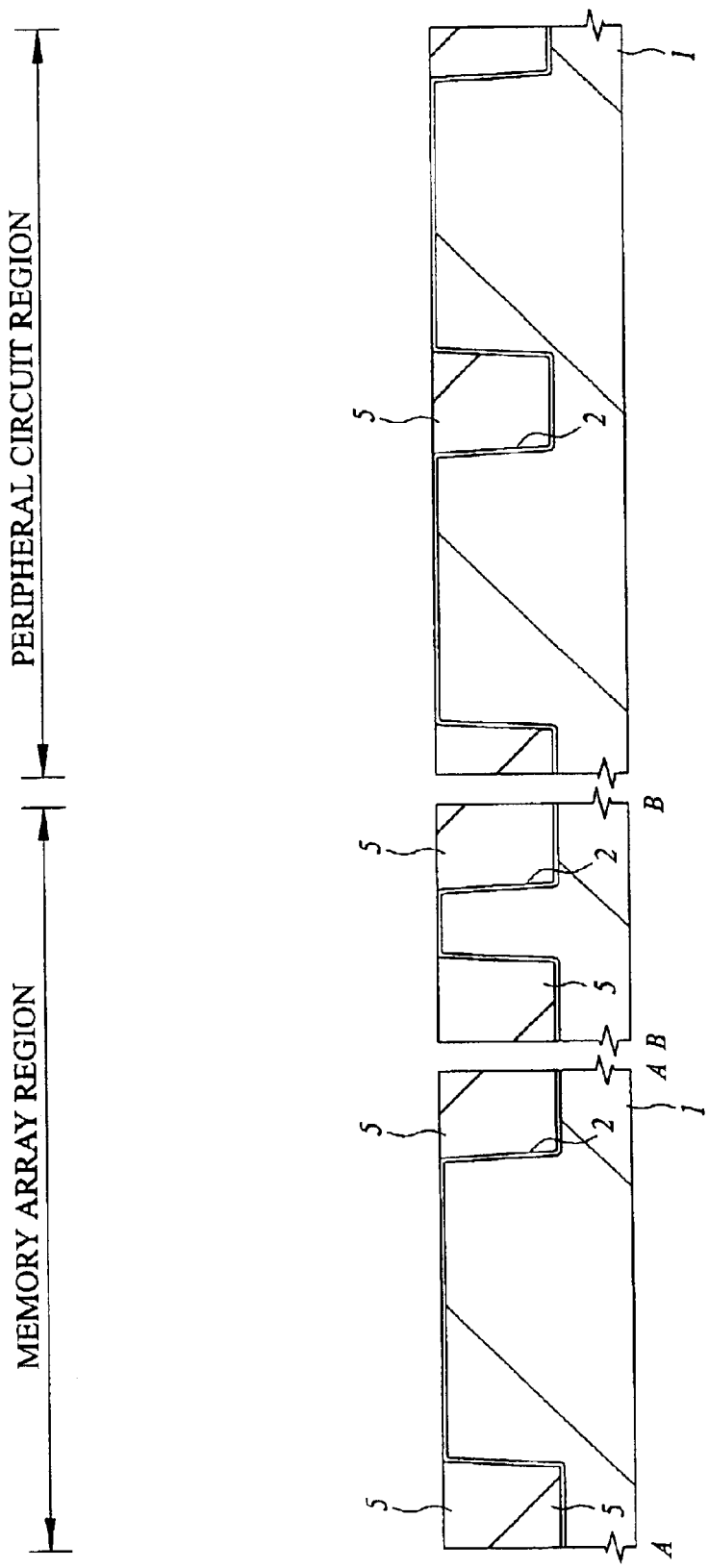
FIG. 1 is a sectional view showing the principal part of a semiconductor substrate that illustrates the manufacturing method of the DRAM according to an embodiment of the present invention.
Figure 2:
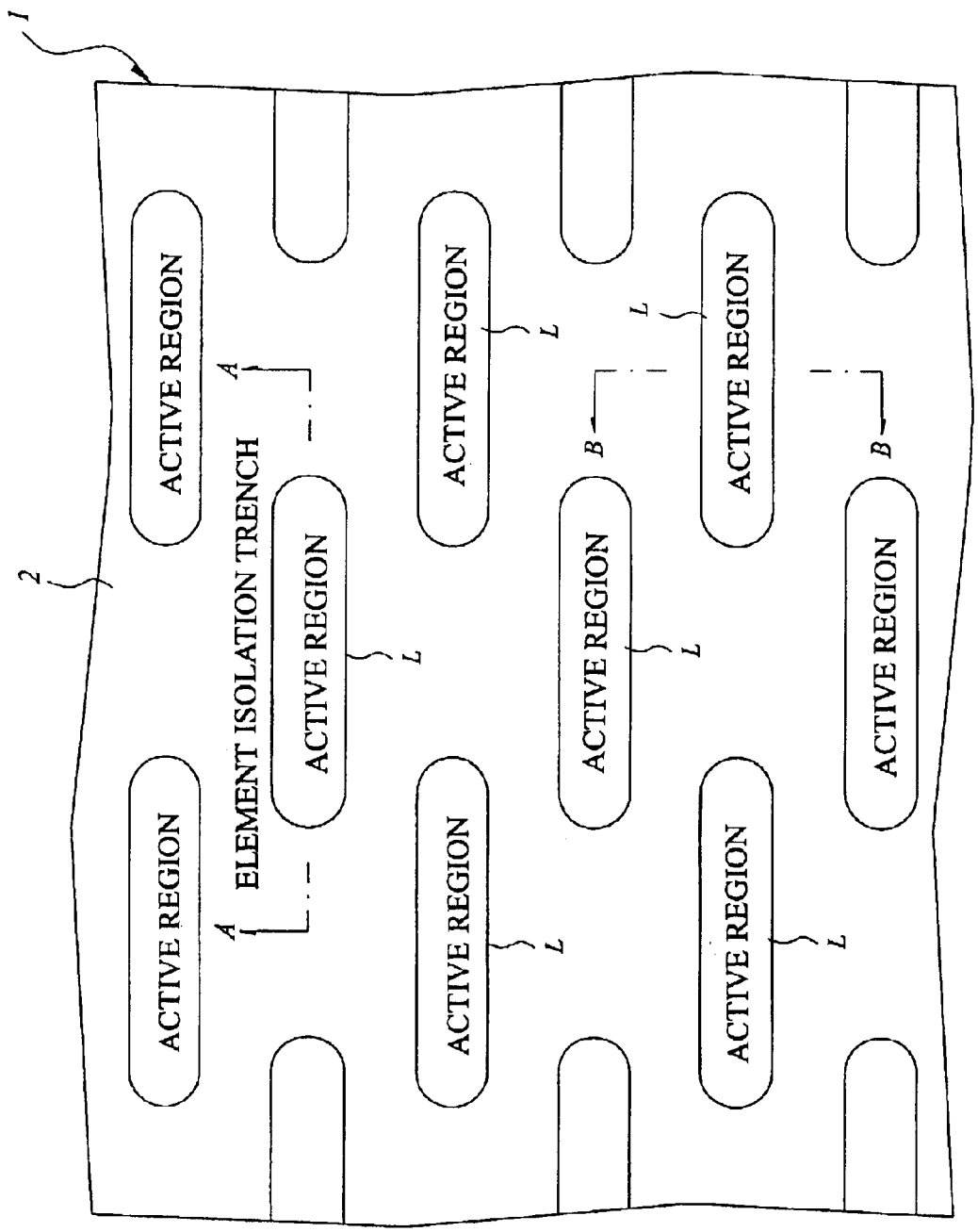
FIG. 2 is a plan view showing the principal part of a semiconductor substrate that illustrates the manufacturing method of the DRAM according to an embodiment of the present invention.

First, as shown in FIGS. 1 and 2, element isolation trench 2 is formed in a main surface of a substrate 1 made of p-type single crystal silicon. As shown in FIG. 1, the substrate 1 is mainly partitioned into a memory array region (left portion and center portion of FIG. 1) and a peripheral circuit region (right portion of FIG. 1). A plurality of MISFETs (memory cell selecting MISFET) and data storage capacitors that constitute the memory cell are formed in the memory array region, and a plurality of complementary MISFETs (n-channel MISFET and p-channel MISFET) that constitute the peripheral circuit are formed in the peripheral circuit region.

The element isolation trench 2 is formed in the substrate 1 in the following manner. That is, a trench with a depth of about 350 nm is formed by etching the substrate 1, and then, a silicon oxide film 5 is deposited in the trench and on the substrate 1 by the CVD (Chemical Vapor Deposition) method. Thereafter, the superfluous silicon oxide film 5 outside the trench is removed by the CMP (Chemical Mechanical Polishing) method. As shown in FIG. 2, when the element isolation trench 2 is formed in the substrate 1, a large number of active regions L with the island-shaped pattern surrounded by the element isolation trench 2 are formed in the substrate 1 in the memory array region. Each two memory cells are formed on the active region L. Note that the left portion of FIG. 1 is a sectional view of the substrate 1 taken along the ling A—A in FIG. 2, and the center portion thereof is a sectional view of the substrate 1 taken along the ling B—B in FIG. 2.

Figure 3:
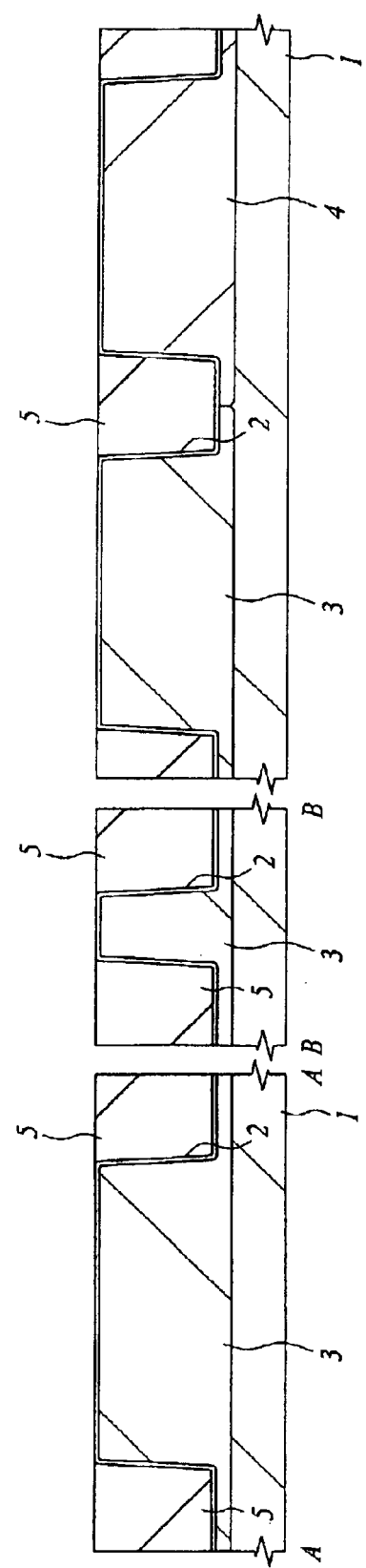
FIG. 3 is a sectional view showing the principal part of a semiconductor substrate that illustrates the manufacturing method of the DRAM according to an embodiment of the present invention.

Next, as shown in FIG. 3, B (boron) ions are implanted into the substrate 1 in the memory array region and a part of the substrate 1 in the peripheral circuit region, and then, P (phosphorus) ions are implanted into the other part of the substrate 1 in the peripheral circuit region. Thereafter, the substrate 1 is subjected to the thermal treatment to diffuse these impurities (B and P). By so doing, a p-type well 3 is formed in the substrate 1 in the memory array region, and a p-type well 3 and an n-type well 4 are formed in the substrate 1 in the peripheral circuit region.

Figure 4:
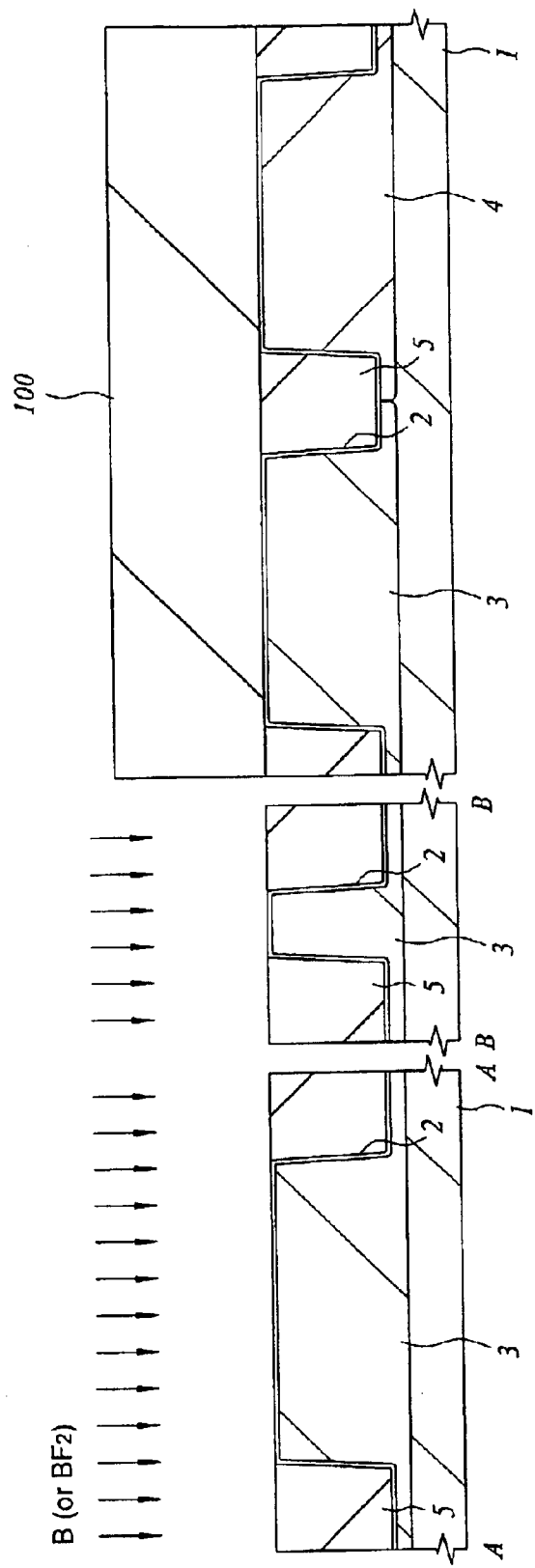
FIG. 4 is a sectional view showing the principal part of a semiconductor substrate that illustrates the manufacturing method of the DRAM according to an embodiment of the present invention.

Next, as shown in FIG. 4, the surface of the substrate 1 in the peripheral circuit region is covered with a photoresist film 100, and B (or $BF_2$) ions are implanted into the p-type well 3 in the memory array region. This impurity ion implantation is intended to control the threshold voltage of the MISFETs (memory cell selecting MISFET) that constitute a part of the memory cell, and the ion implantation is performed under the conditions of, for example, implantation energy is 45 keV and dose amount is $6.8 \times 10^{12}/cm^2$ in this embodiment.

Figure 5:
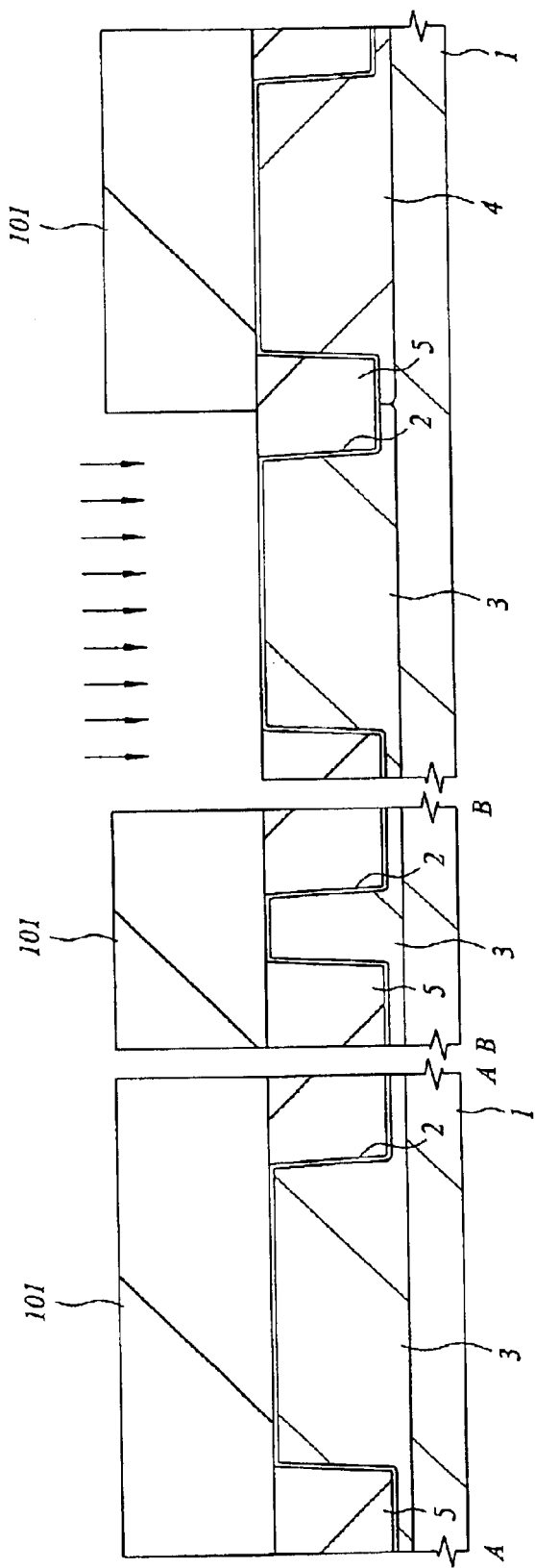
FIG. 5 is a sectional view showing the principal part of a semiconductor substrate that illustrates the manufacturing method of the DRAM according to an embodiment of the present invention.
Figure 6:
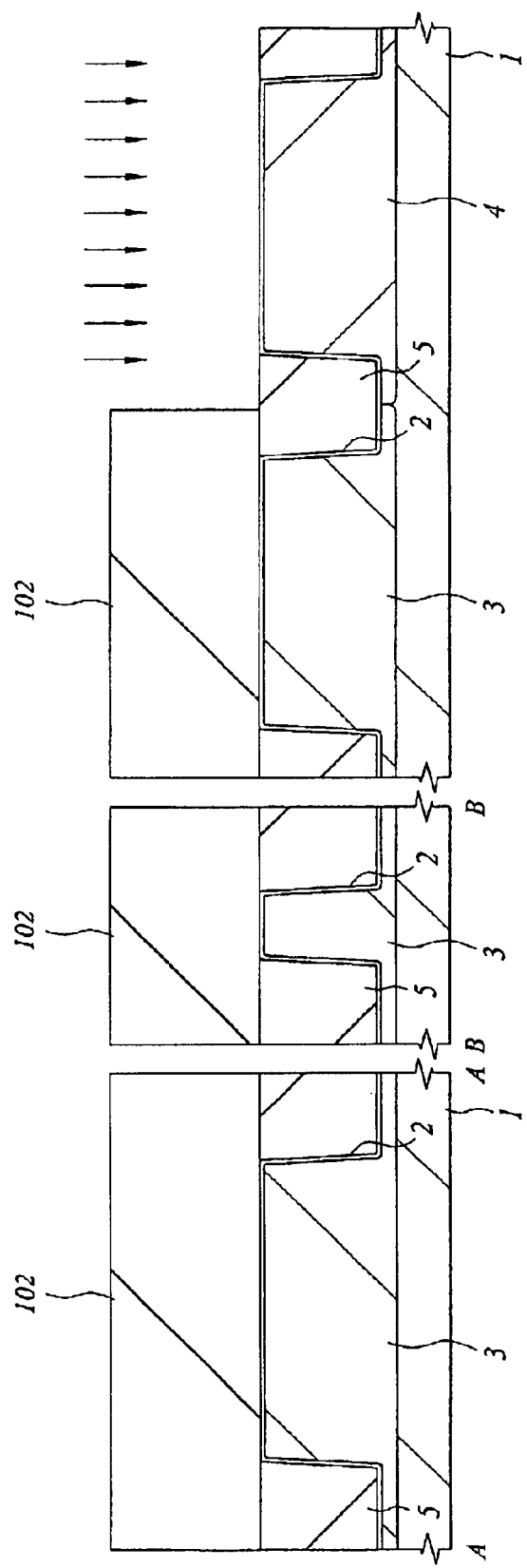
FIG. 6 is a sectional view showing the principal part of a semiconductor substrate that illustrates the manufacturing method of the DRAM according to an embodiment of the present invention.

Next, after the removal of the photoresist film 100, as shown in FIG. 5, the surface of the n-type well 4 in the peripheral circuit region and that of the p-type well 3 in the memory array region are covered with a photoresist film 101 and $BF_2$ ions are implanted into the p-type well 3 in the peripheral circuit region. In this case, the implantation energy is, for example, 45 keV and the dose amount is $1 \times 10^{12}/cm^2$. Subsequently, after the removal of the photoresist film 101, as shown in FIG. 6, the surface of the p-type well 3 in the peripheral circuit region and that of the p-type well 3 in the memory array region are covered with a photoresist film 102 and $BF_2$ ions are implanted into the n-type well 4 in the peripheral circuit region. In this case, the implantation energy is, for example, 45 keV and the dose amount is $1 \times 10^{12}/cm^2$. These impurity ion implantations are intended to control the threshold voltage of the complementary MISFET (n-channel MISFETs and p-channel MISFET) that constitute the peripheral circuit.

Figure 7:
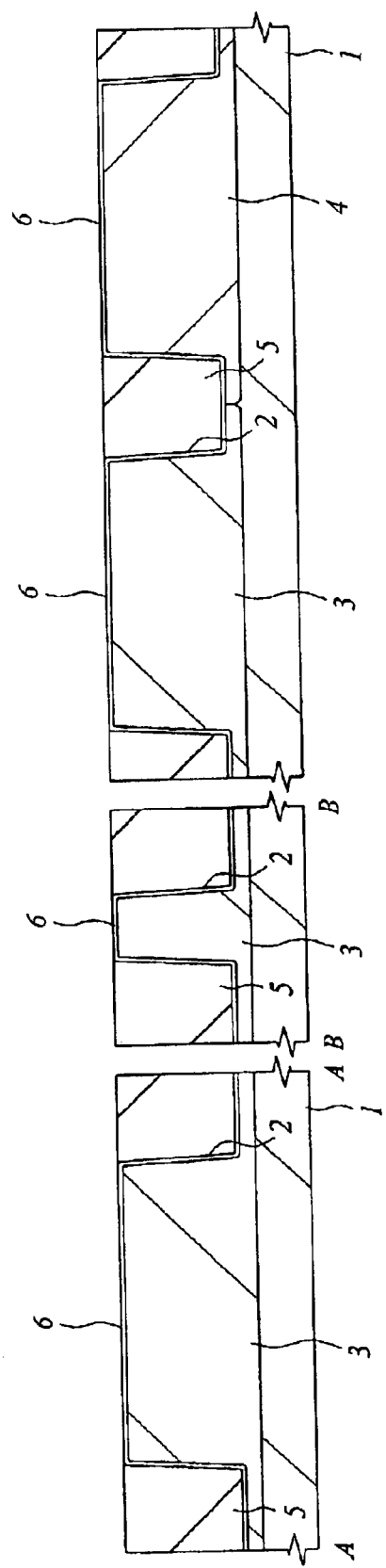
FIG. 7 is a sectional view showing the principal part of a semiconductor substrate that illustrates the manufacturing method of the DRAM according to an embodiment of the present invention.

Next, the photoresist film 102 is removed, and then, the surface of the substrate 1 is cleaned by the use of hydrofluoric acid. Thereafter, the substrate 1 is subjected to the wet oxidation at about 800° C. By so doing, a gate insulating film 6 made of silicon oxide is formed on the surface of the substrate 1 (p-type well 3 and n-type well 4) as shown in FIG. 7. The thickness of the gate insulating film 6 is, for example, 6.3 nm and it is constant in both the memory array region and the peripheral circuit region.

Figure 8:
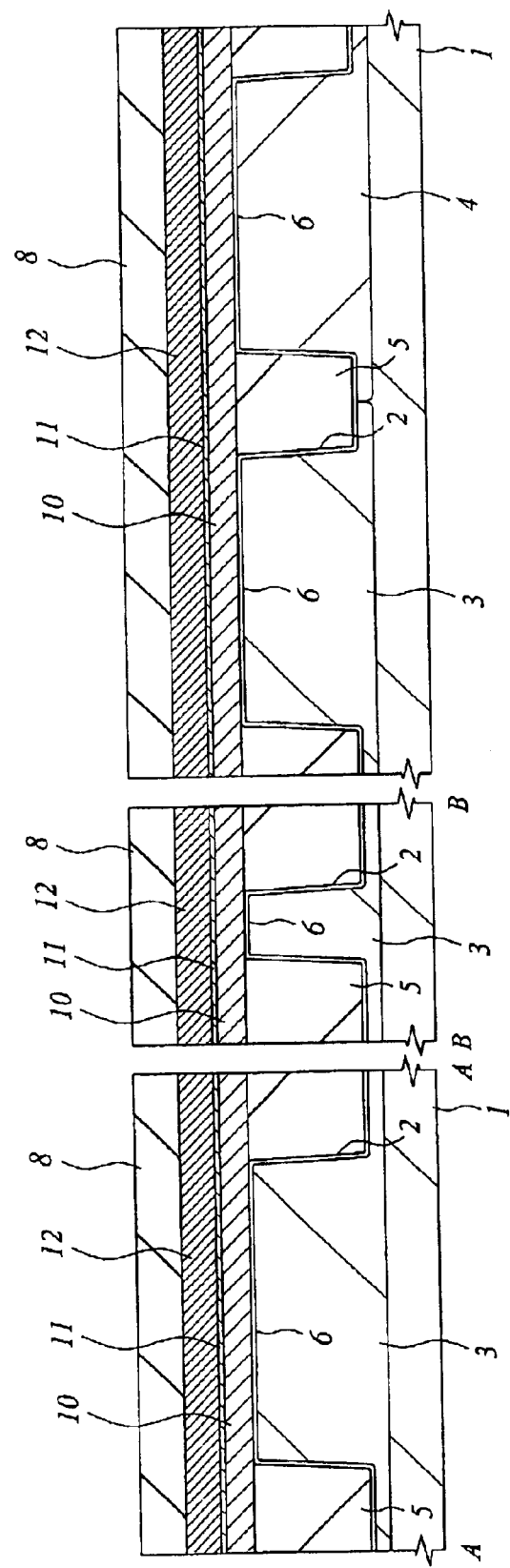
FIG. 8 is a sectional view showing the principal part of a semiconductor substrate that illustrates the manufacturing method of the DRAM according to an embodiment of the present invention.

Next, as shown in FIG. 8, after a polycrystalline silicon film 10 with thickness of about 70 nm is deposited on the substrate 1 by the CVD method, a WN (tungsten nitride) film 11 with thickness of about 5 nm and a W (tungsten) film 12 with thickness of about 80 nm are deposited thereon by the sputtering method, and then, a silicon nitride film 8 with thickness of about 100 nm is deposited further thereon by the CVD method. P (phosphorus) is doped into the polycrystalline silicon film 10 during its deposition in order to reduce the resistance thereof. The WN film 11 functions as a barrier layer to prevent the reaction (silicide reaction) between the polycrystalline silicon film 10 and the W film 12 at the interface therebetween.

The polycrystalline silicon film 10 and the W film 12 deposited thereon serve as the gate electrode materials of the MISFET. More specifically, in the DRAM in the first embodiment, the laminated film (polymetal film) of the polycrystalline silicon film 11 and the W film 12 constitutes the gate electrode material in order to reduce the resistance of the gate electrode of the MISFET.

Figure 9:
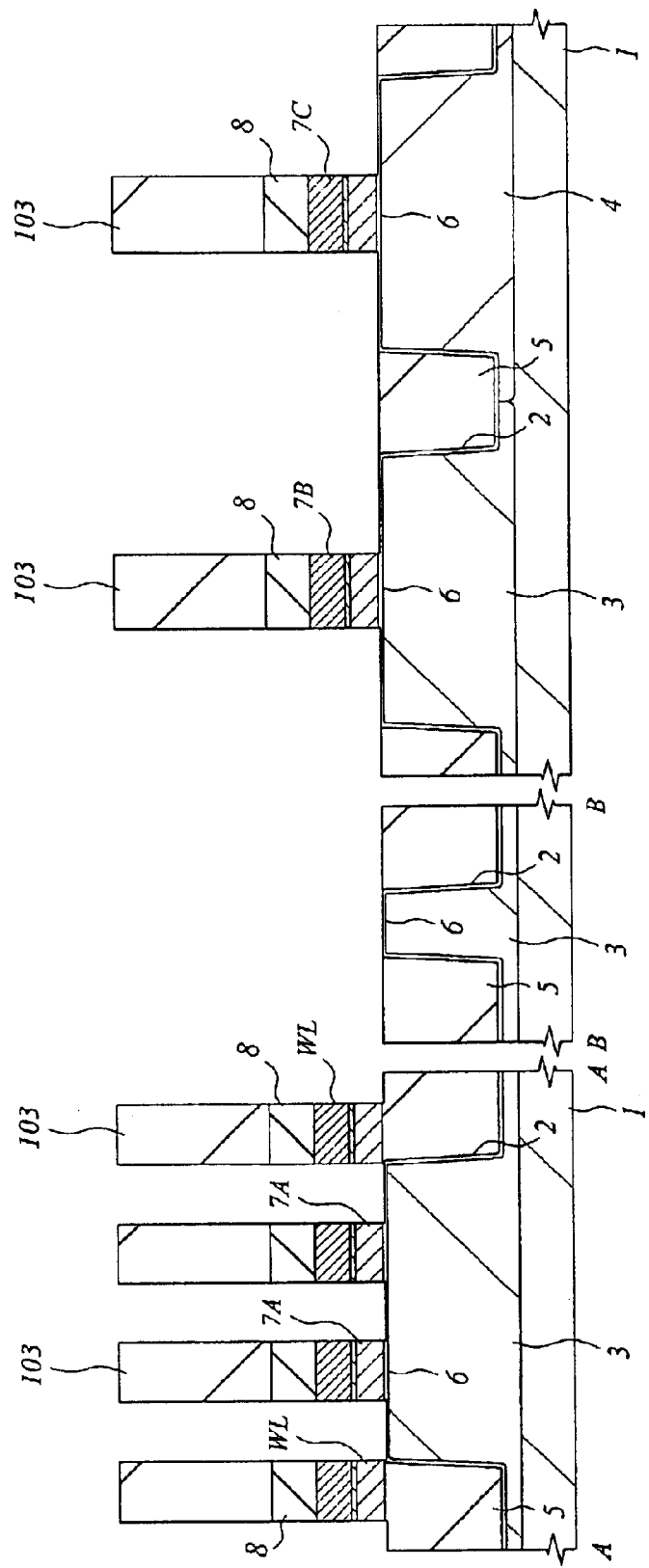
FIG. 9 is a sectional view showing the principal part of a semiconductor substrate that illustrates the manufacturing method of the DRAM according to an embodiment of the present invention.
Figure 10:
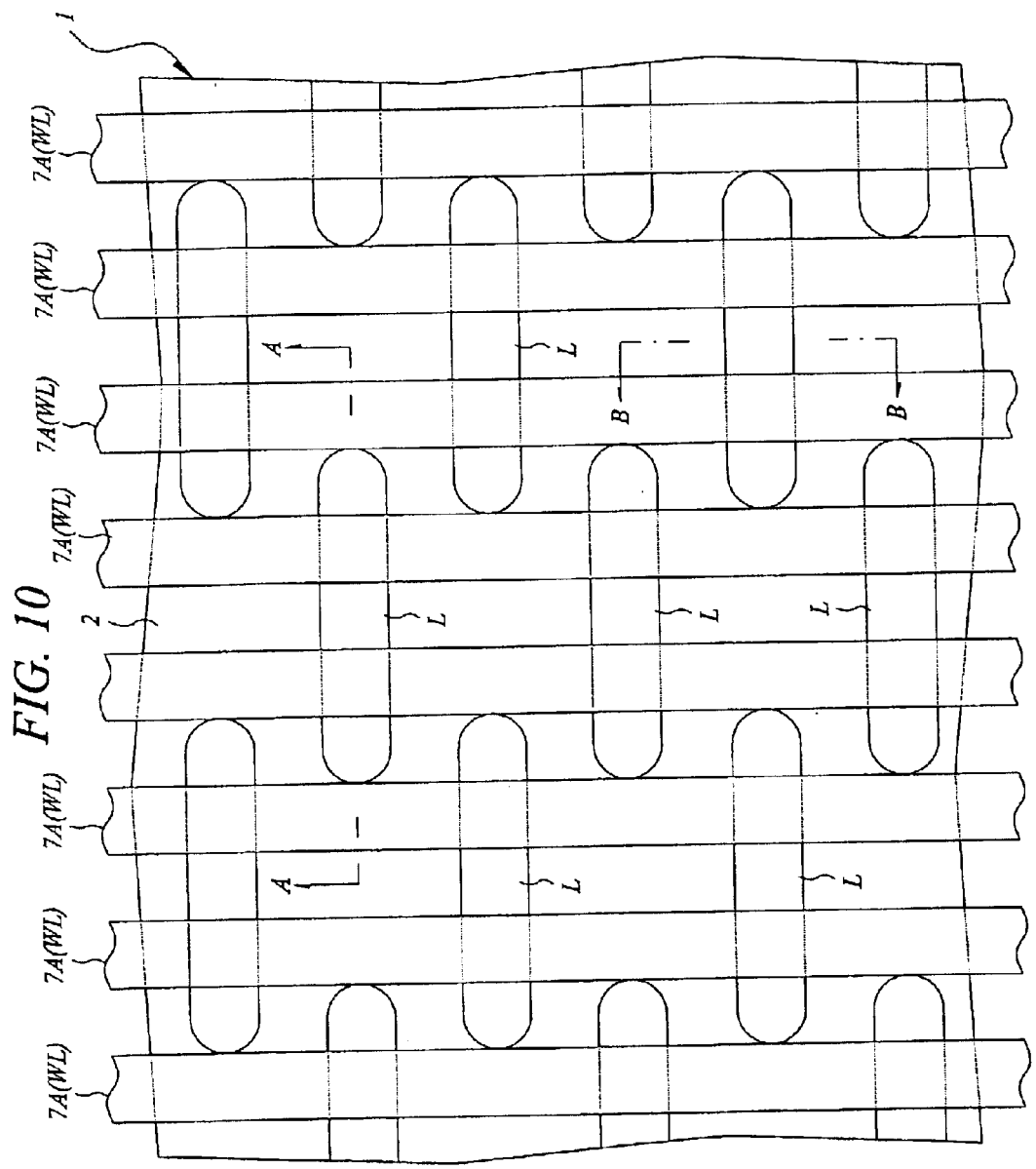
FIG. 10 is a plan view showing the principal part of a semiconductor substrate that illustrates the manufacturing method of the DRAM according to an embodiment of the present invention.

Next, as shown in FIG. 9, the silicon nitride film 8, the W film 12, the WN film 11, and the polycrystalline silicon film 10 are dry-etched with using a photoresist film 103 formed on the silicon nitride film 8 as a mask, thereby forming a gate electrode 7A in the memory array region and gate electrodes 7B and 7C in the peripheral circuit region. As shown in FIG. 10, the gate electrode 7A formed in the memory array region extends in a direction orthogonal to the long side of the active region L, and the gate electrode 7A functions as word lines WL in the region other than the active region L. The width (gate length) of the gate electrode 7A (word line WL) is 0.16 μm, and the gate length of the gate electrodes 7B and 7C formed in the peripheral circuit region is 0.25 μm.

Figure 11:
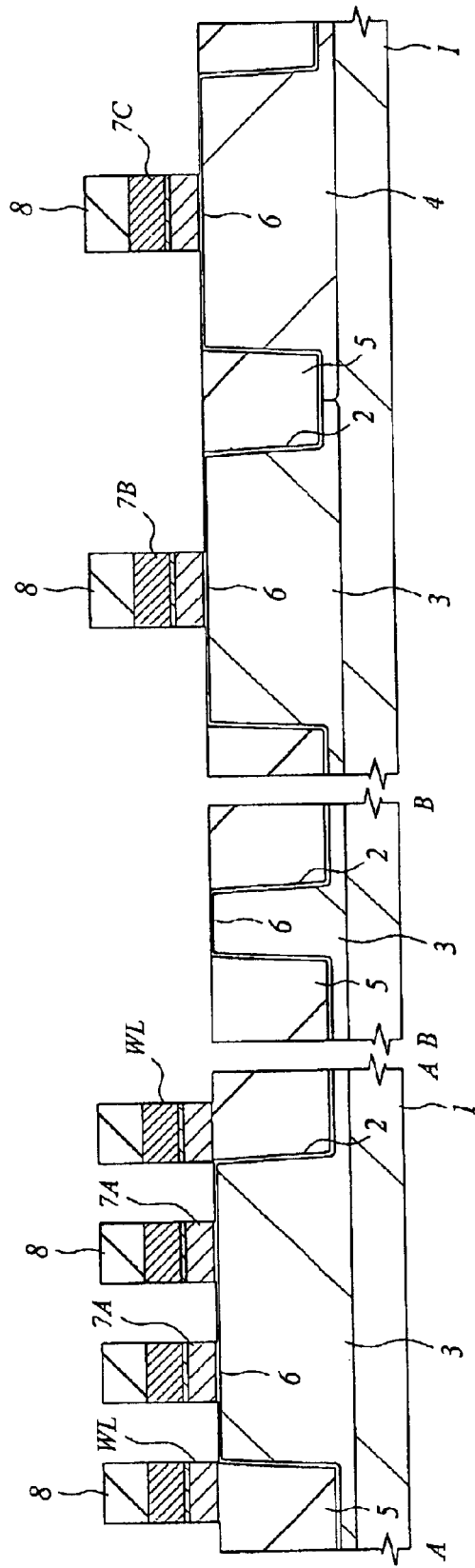
FIG. 11 is a sectional view showing the principal part of a semiconductor substrate that illustrates the manufacturing method of the DRAM according to an embodiment of the present invention.

Next, as shown in FIG. 11, the photoresist film 103 used in the etching to form the gate electrodes 7A, 7B, and 7C is removed. At this time, foreign matters such as etching residues of the gate electrode materials and the photoresist residues are adhered on the surface of the substrate 1. Therefore, the surface of the substrate 1 is cleaned by the use of hydrofluoric acid diluted so as not to remove the gate insulating film 6 so much.

Figure 12:
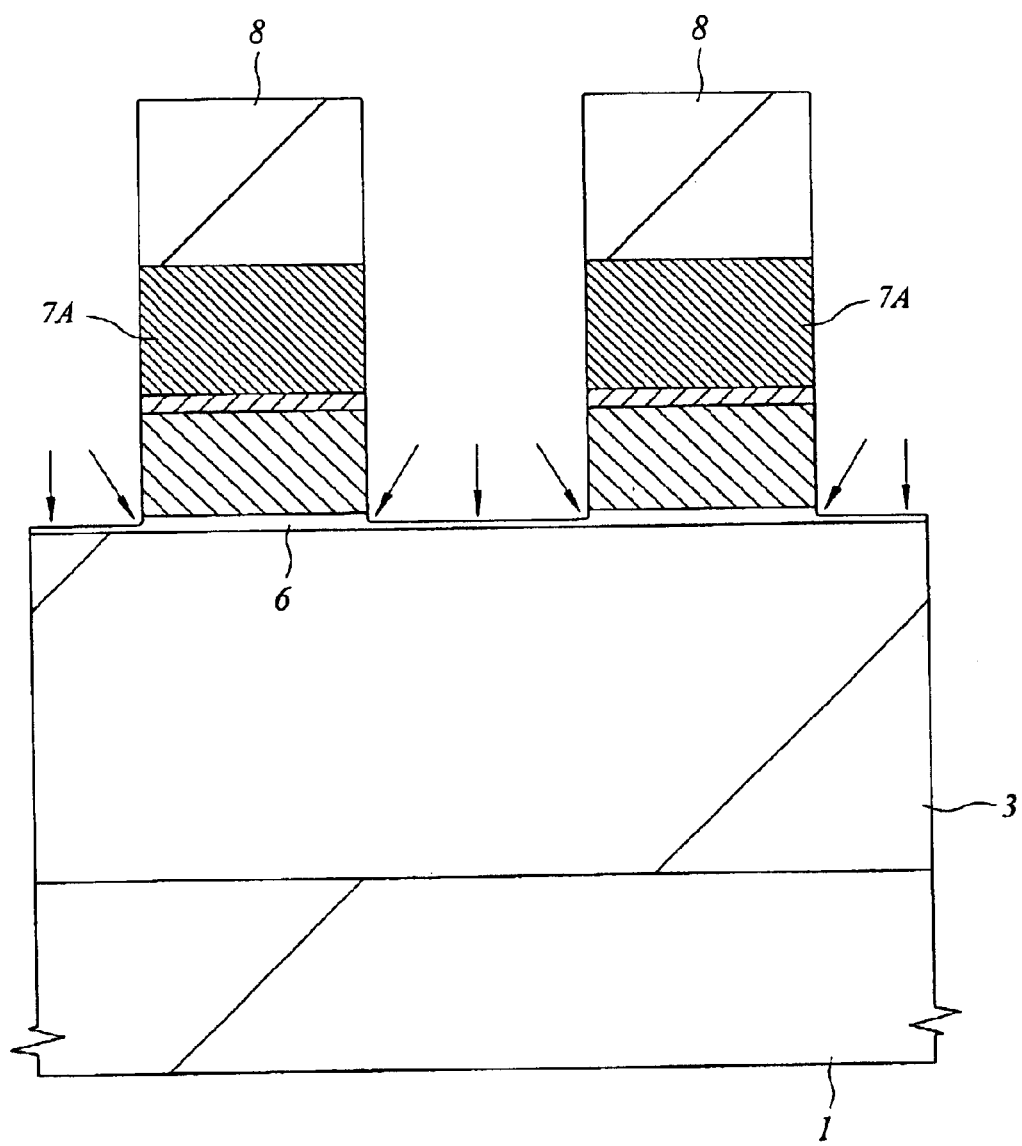
FIG. 12 is an enlarged sectional view showing the principal part of a semiconductor substrate that illustrates the manufacturing method of the DRAM according to an embodiment of the present invention.

As shown in FIG. 12, after the dry etching to form the gate electrodes 7A, 7B, and 7C and the subsequent cleaning by hydrofluoric acid, the gate insulating film 6 below the sidewall portions of the gate electrodes 7A, 7B, and 7C and the gate insulating film 6 in the periphery thereof are removed to some extent, and the thickness thereof is reduced. As a result, a problem that the gate breakdown voltage becomes lower is caused if no measures are taken.

For its solution, after the cleaning by hydrofluoric acid, the substrate 1 is subjected to the thermal treatment (re-oxidation process) to increase the thickness of the gate insulating film 6 whose thickness has been reduced. In order to prevent the production of high-resistance W oxide by the oxidation of the W films 12 exposed on the sidewalls of the gate electrodes 7A, 7B, and 7C, this re-oxidation process is performed in an atmosphere where Si (silicon) can be oxidized but W cannot be oxidized. In this embodiment, the substrate 1 is subjected to the thermal treatment for about 20 minutes at 800° C. in a reducing atmosphere of mixed gas containing hydrogen 90% and water vapor 10%.

Figure 13:
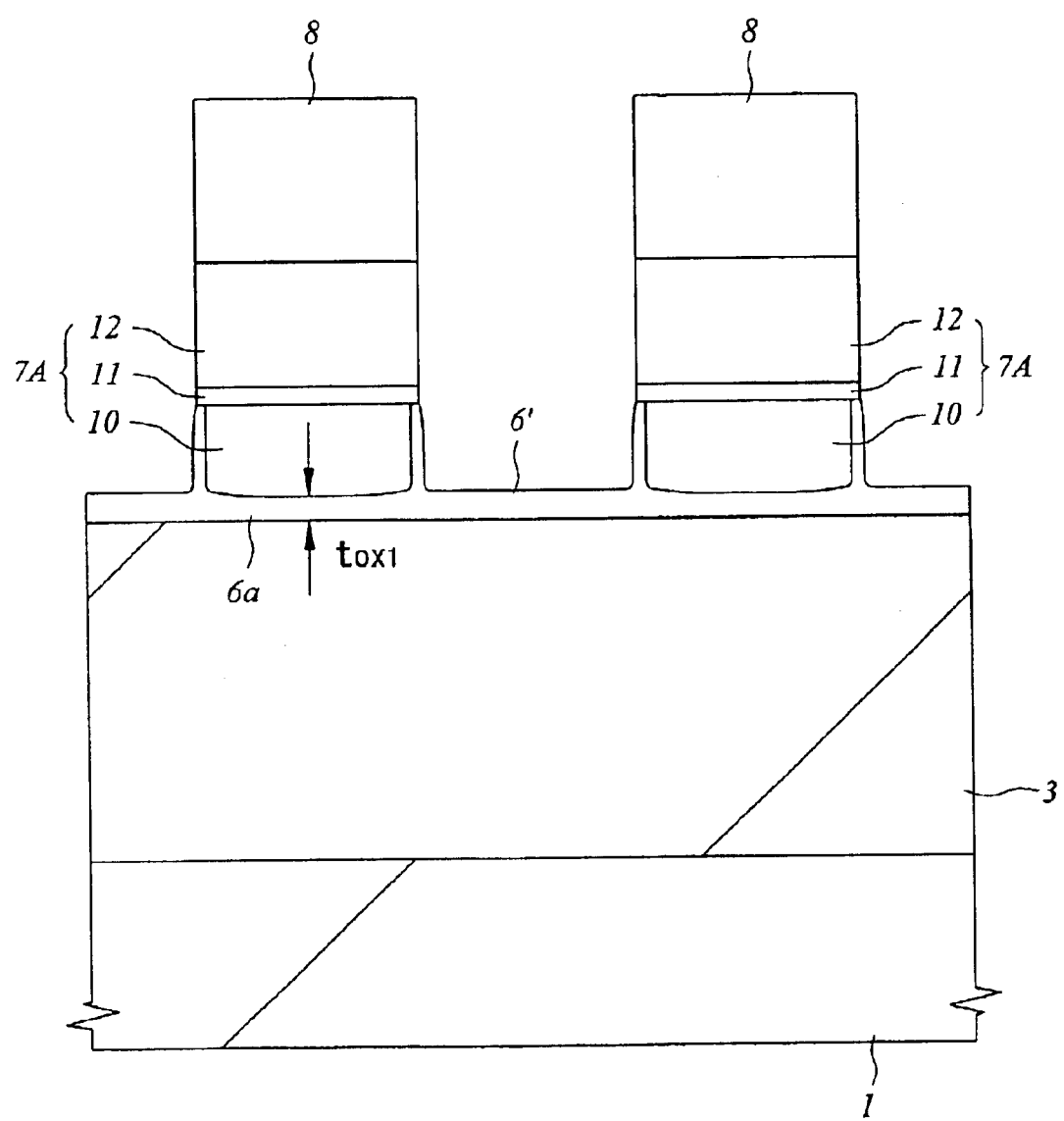
FIG. 13 is an enlarged sectional view showing the principal part of a semiconductor substrate that illustrates the manufacturing method of the DRAM according to an embodiment of the present invention.

As shown in FIG. 13, by the re-oxidation process described above, the gate insulating film 6 below the sidewall portion of the gate electrode 7 formed in the memory array region and that in the periphery of the gate electrode 7 are grown to be a gate insulating film 6' with a large thickness (about 9 nm). As described above, the gate length of the gate electrode 7A formed in the memory array region is extremely short, that is, 0.16 μm. Therefore, in the case where the gate insulating film 6' with a large thickness is formed below the sidewall portion of the gate electrode 7A, since the bird's beak thereof reaches into the center of the gate electrode 7A, a gate insulating film 6a with thickness (tox1=about 9 nm) larger than that of the gate insulating film 6 before the re-oxidation is formed just below the center of the gate electrode 7A. Note that "center of the gate electrode" mentioned here indicates the center portion in terms of the gate length direction (channel direction) of the gate electrode.

Figure 14:
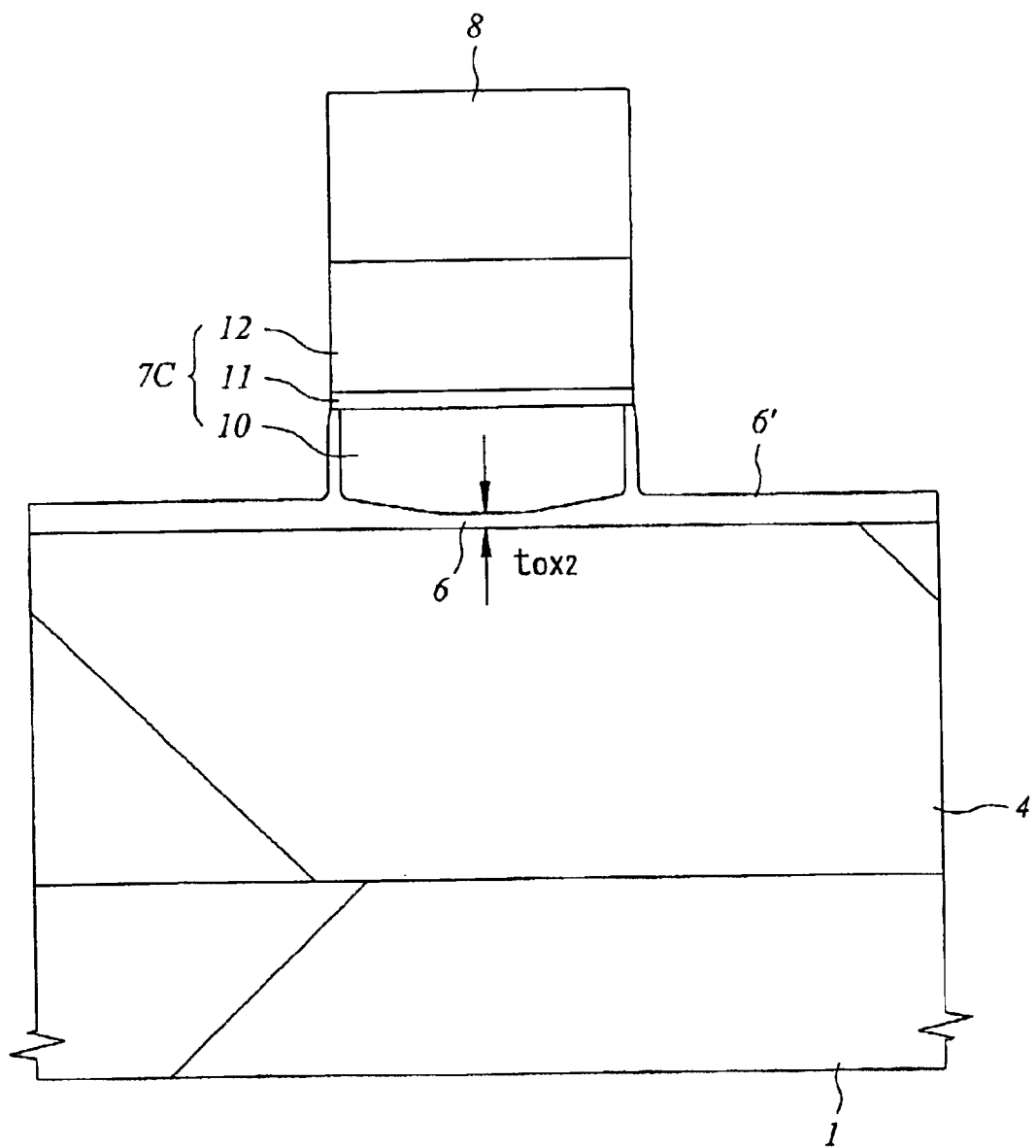
FIG. 14 is an enlarged sectional view showing the principal part of a semiconductor substrate that illustrates the manufacturing method of the DRAM according to an embodiment of the present invention.

In addition, as shown in FIG. 14, by the re-oxidation process described above, the gate insulating film 6 below the sidewall portion of the gate electrode 7 formed over the n-type well 4 in the peripheral circuit region and that in the periphery of the gate electrode 7C are also grown to be a gate insulating film 6' with a large thickness (about 9 nm). Although not shown, the gate insulating film 6 below the sidewall portion of the gate electrode 7B formed over the p-type well 3 in the peripheral circuit region and that in the periphery of the gate electrode 7B are also grown to be a gate insulating film 6' with a large thickness.

However, since the gate length of the gate electrodes 7B and 7C formed in the peripheral circuit region is longer than that of the gate electrode 7A (0.25 μm) formed in the memory array region, even in the case where the gate insulating film 6' with large thickness is formed below the sidewall portions of the gate electrodes 7B and 7C, the bird's beak does not reach into the center of the gate electrodes 7B and 7C. Therefore, the thickness of the gate insulating film 6 (tox2) just below the center of the gate electrodes 7B and 7C is almost same as that (about 6.3 nm) before the re-oxidation process.

As described above, when the gate electrode 7A with a short gate length is formed in the memory array region and the gate electrodes 7A and 7B with a long gate length are formed in the peripheral circuit region, and then, the re-oxidation process for increasing the thickness of the gate insulating film 6 below the sidewall edges of the gate electrodes 7A, 7B, and 7C is performed, the gate insulating films 6' and 6a with a large thickness (tox1=about 9 nm) are formed below the sidewall edges of the gate electrode 7A in the memory array region and just below the center of the same. Meanwhile, though a gate insulating film 6' with a large thickness (about 9 nm) is also formed below the sidewall edges of the gate electrodes 7B and 7C in the peripheral circuit region, the gate insulating film 6 with almost the same thickness (tox2=about 6.3 nm) as that before the re-oxidation process remains just below the center of the gate electrodes 7B and 7C. More specifically, as a result of the re-oxidation process, the difference in thickness between the gate insulating film 6a just below the center of the gate electrode 7A and the gate insulating film 6' just below the sidewall portion of the same becomes larger than the difference in thickness between the gate insulating film 6 just below the center of the gate electrodes 7B and 7C and the gate insulating film 6' just below the sidewall portion of the same.

Figure 15:
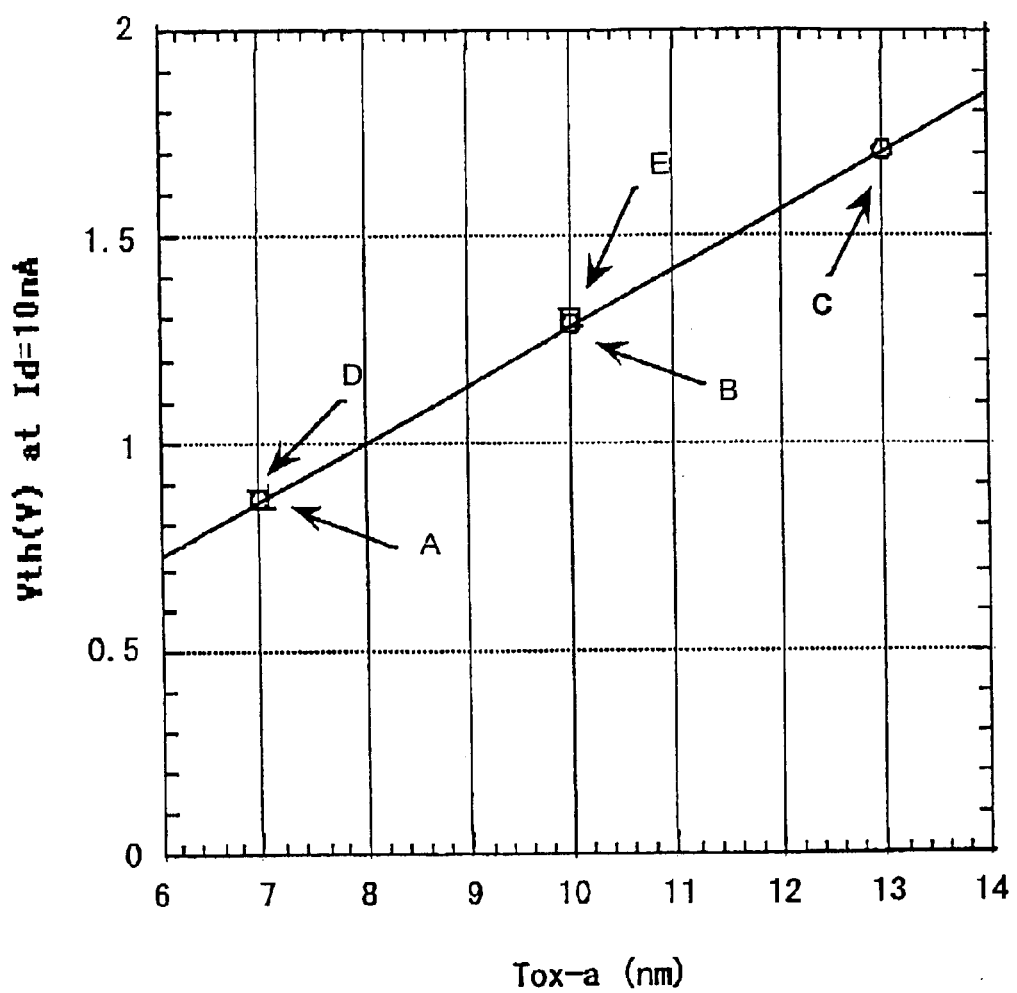
FIG. 15 is a graph representing the simulation result of the relationship between the film thickness of the gate insulating film located just below the center of the gate electrode and the threshold voltage of the MISFET.
Figure 16:
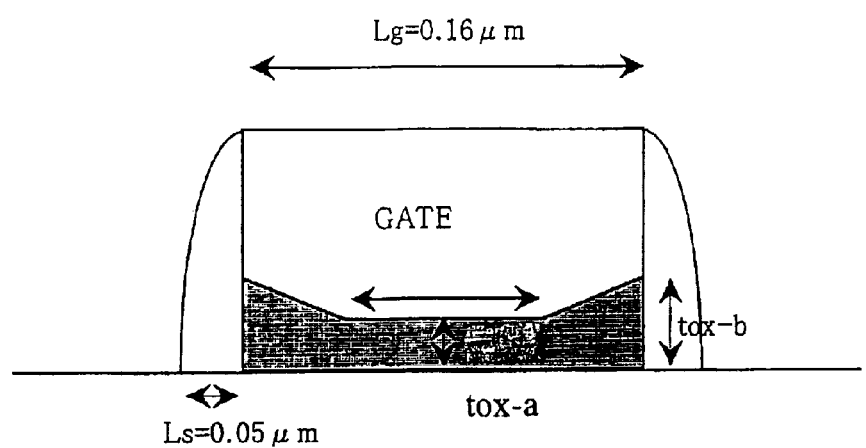
FIG. 16 is a diagram that illustrates the gate length of the MISFET used in the simulation shown in FIG. 15.

FIG. 15 is a graph representing the simulation result of the relationship between the film thickness (tox-a) of the gate insulating film located just below the center of the gate electrode and the threshold voltage (Vth) of the MISFET. As shown in FIG. 16, five MISFETs (A to E) are prepared, each having the same gate length (0.16 μm) but having different gate insulating film thicknesses below the sidewall edge of the gate electrode and just below the center of the same. More specifically, in the MISFET (A), the film thickness of the gate insulating film located just below the center of the gate electrode (tox-a) is 7 nm and that of the gate insulating film located below the sidewall edge of the gate electrode (tox-b) is 7 nm. Also, in the MISFET (B), tox-a is 10 nm and tox-b is 10 nm. In the MISFET (C), tox-a is 13 nm and tox-b is 13 nm. In the MISFET (D), tox-a is 7 nm and tox-b is 9.4 nm. In the MISFET (E), tox-a is 10 nm and tox-b is 12.4 nm. In this case, the MISFET (A) and the MISFET (D) have the same tox-a (7 nm) and different tox-b. In addition, the MISFET (B) and the MISFET (E) have the same tox-a (10 nm) and different tox-b.

As shown in FIG. 15, the two MISFETs (A) and (D) having different tox-b and equal tox-a (7 nm) have the threshold voltage (Vth) equal to each other. Similarly, the two MISFETs (B) and (E) having different tox-b and equal tox-a (10 nm) have the threshold voltage (Vth) equal to each other. Consequently, it can be found that the threshold voltage (Vth) of the MISFET is generally determined depending on the film thickness of the gate insulating film located just below the center of the gate electrode (tox-a) not the film thickness of the gate insulating film located below the sidewall edge of the gate electrode (tox-b).

As described above, when the film thickness of the gate insulating film just below the gate electrodes 7B and 7C formed in the peripheral circuit region and the film thickness of the gate insulating film just below the gate electrode 7A formed in the memory array region are compared, these films have equal thickness at the position just below the sidewall edge of the gate electrodes. Meanwhile, when comparing the thicknesses just below the center of the gate electrode, the gate insulating film 6a formed in the memory array region has larger thickness than the gate insulating film 6 formed in the peripheral circuit region. Therefore, according to the simulation result described above, it can be understood that the threshold voltage of the memory cell selecting MISFET formed in the memory array region is higher than that of the complementary MISFET (n-channel MISFET and p-channel MISFET) formed in the peripheral circuit region.

Figure 17:
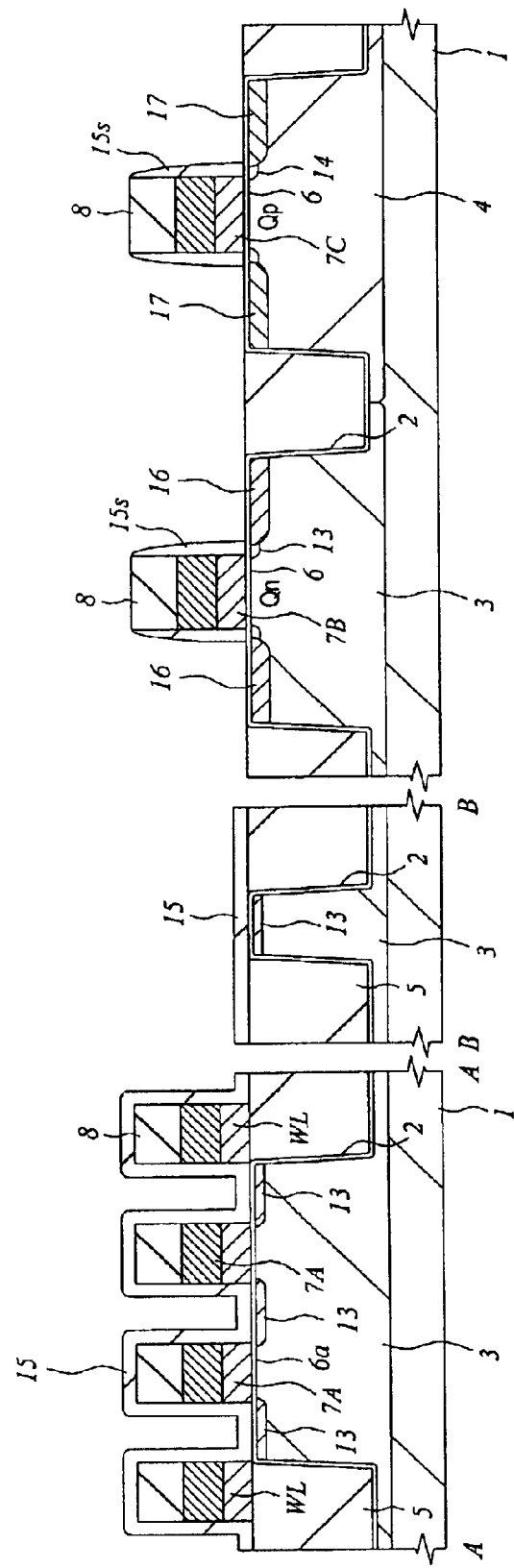
FIG. 17 is a sectional view showing the principal part of a semiconductor substrate that illustrates the manufacturing method of the DRAM according to an embodiment of the present invention.

FIG. 17 shows the state where the memory cell selecting MISFET Qt is formed in the memory array region and the n-channel MISFET Qn and the p-channel MISFET Qp are formed in the peripheral circuit region after the above-described re-oxidation process. These MISFETs (Qt, Qn, and Qp) are formed in the following manner. That is, ions of As (arsenic) are implanted into the p-type well 3 to form an n⁻-type semiconductor region 13 in the p-type well 3 on both sides of the gate electrodes 7A and 7B, and ions of B (boron) are implanted into the n-type well 4 to form a p⁻-type semiconductor region 14 in the n-type well 4 on both sides of the gate electrode 7C. Thereafter, a silicon nitride film 15 is deposited on the substrate 1 by the CVD method. Then, sidewall spacers 15s are formed on the sidewalls of the gate electrodes 7B and 7C by the anisotropic etching of the silicon nitride film 15 in the peripheral circuit region. Subsequently, ions of As (arsenic) or P (phosphorus) are implanted into the p-type well 3 in the peripheral circuit region to form n⁺-type semiconductor regions (source and drain) 16 with high impurity concentration in the p-type well 3 on both sides of the gate electrode 7B, and ions of B (boron) are implanted into the n-type well 4 to form p⁺-type semiconductor regions (source and drain) 17 with high impurity concentration in the n-type well 4 on both sides of the gate electrode 7C.

Figure 18:
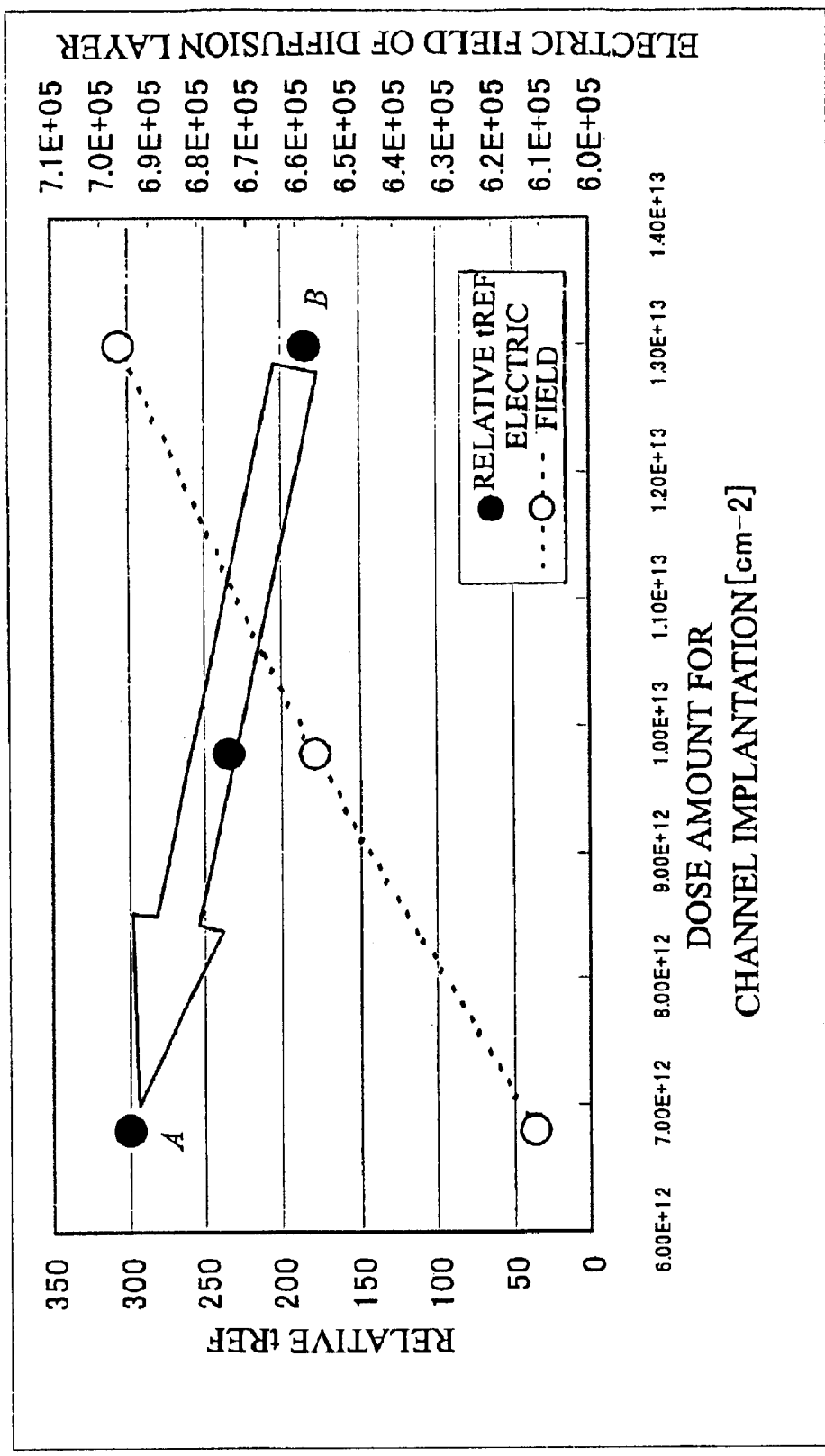
FIG. 18 is a graph representing the relationship among the dose amount of the impurity ion-implanted into the channel region of the memory cell selecting MISFET, the electric field of the diffusion layer, and the refresh characteristics.

FIG. 18 is a graph representing the relationship among the dose amount of the impurity ion-implanted into the channel region of the memory cell selecting MISFET, the electric field of the diffusion layer (source and drain), and the refresh characteristics (relative tREF). Black dots on the drawing represent the dose amount of the impurity ion-implanted into the channel region. The black dot (A) represents the impurity dose amount according to this embodiment (=6.8×10¹²/cm²), and the black dot (B) represents the impurity dose amount before the application of the present invention, that is, the impurity dose amount increased to $1.3 \times 10^{13}/cm^2$ so as to keep the threshold voltage at a predetermined level or higher. Also, the white dots on the graph represent the electric field of the diffusion layer (source and drain).

As shown in FIG. 18, according to this embodiment, the field intensity of the diffusion layer (source and drain) is reduced by the reduction of the impurity dose amount in the channel region. As a result, the refresh characteristics (relative tREF) of the memory cell are improved about 1.6 times in comparison to that before the application of this first embodiment.

As described above, according to the first embodiment, since the impurity dose amount in the channel region can be reduced by increasing the thickness of the gate insulating film 6a of the memory cell selecting MISFET Qt to increase the threshold voltage, the refresh characteristics of the memory cell can be improved. Meanwhile, since it is possible to reduce the thickness of the gate insulating film 6 of the n-channel MISFET Qn and the p-channel MISFET Qp that constitute the peripheral circuit, the high performance and the low-voltage operation of the MISFETs (Qn and Qp) can be realized.

In addition, according to the first embodiment, since two kinds of gate insulating films 6 and 6a having different thicknesses are formed by the use of the re-oxidation process after the formation of the gate electrodes 7A, 7B, and 7C, it is possible to realize the two-level gate insulator process for the DRAM without increasing the number of manufacturing steps and that of photomasks. As a result, it is possible to prevent the increase of the manufacturing cost due to the introduction of the two-level gate insulator process.

Figure 19:
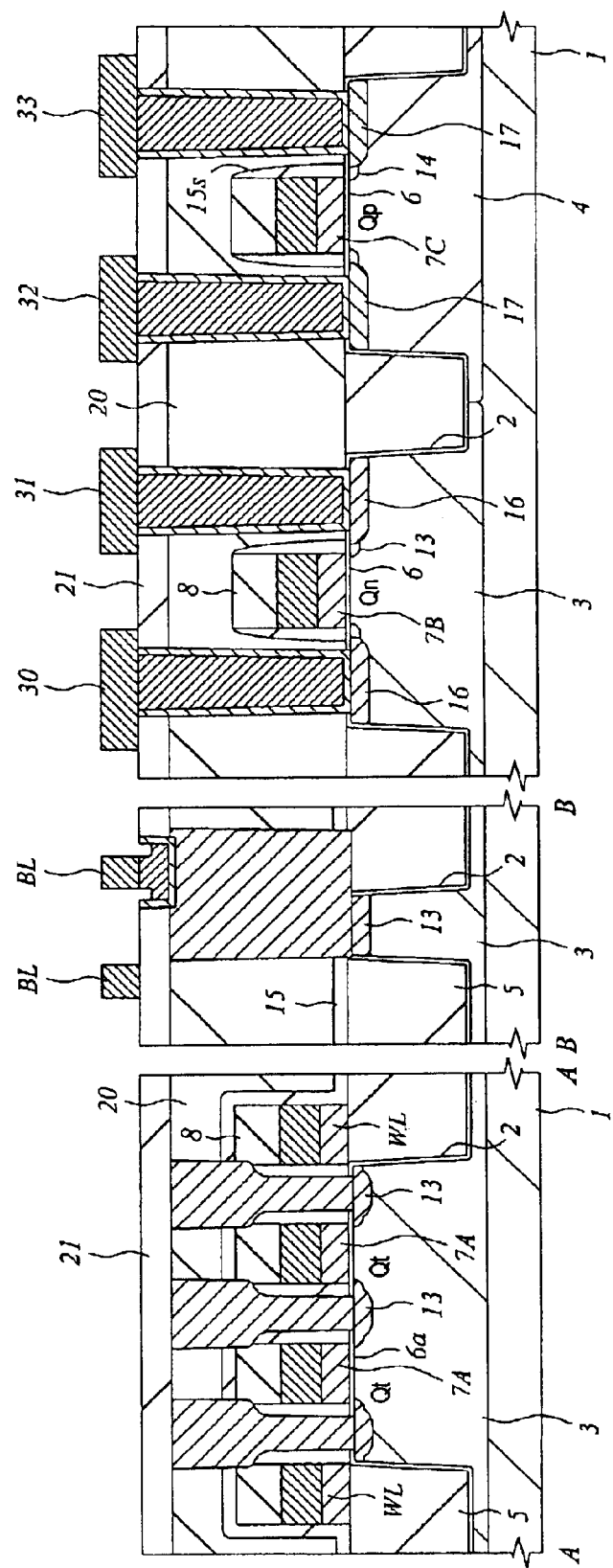
FIG. 19 is a sectional view showing the principal part of a semiconductor substrate that illustrates the manufacturing method of the DRAM according to an embodiment of the present invention.
Figure 20:
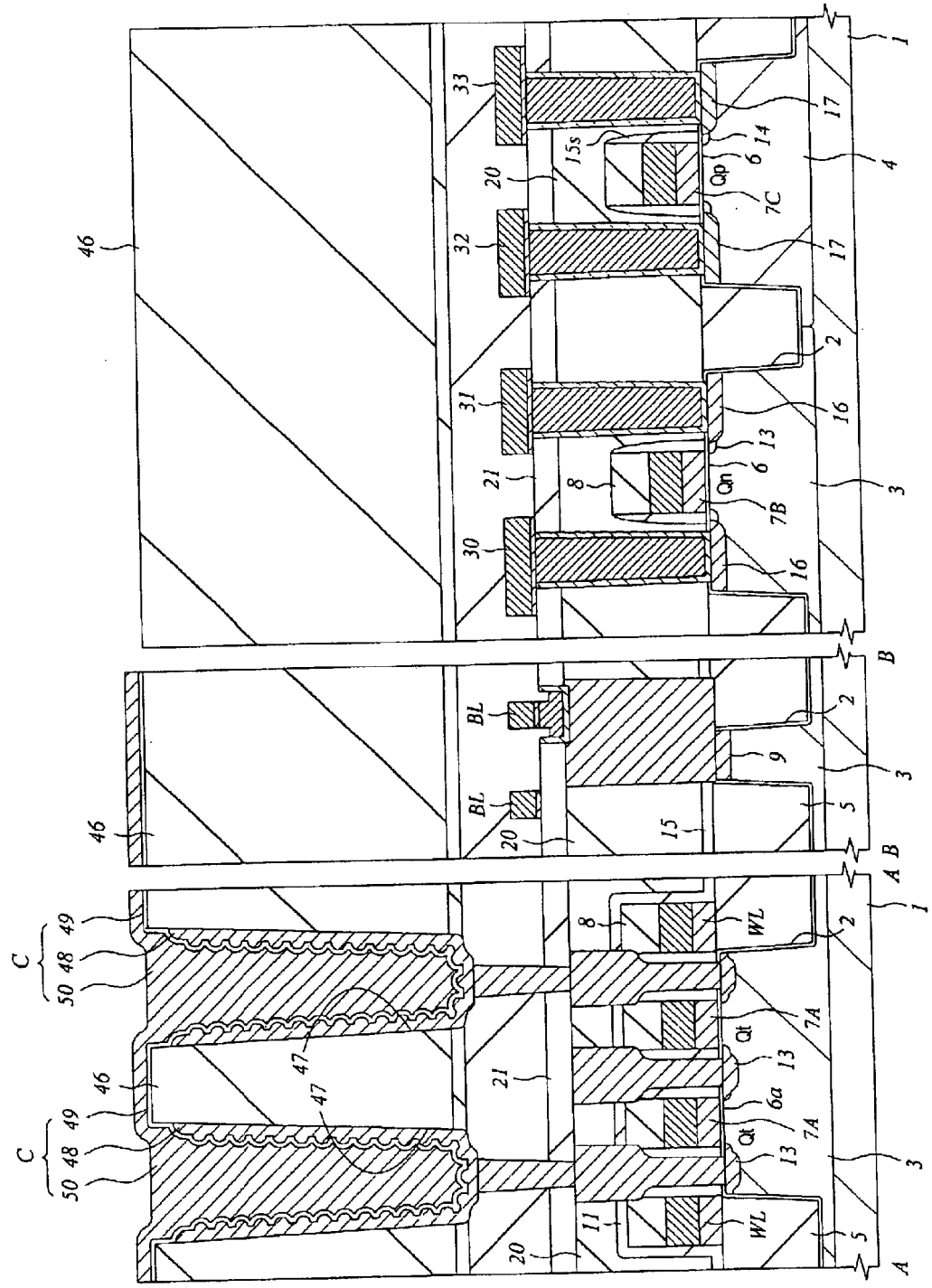
FIG. 20 is a sectional view showing the principal part of a semiconductor substrate that illustrates the manufacturing method of the DRAM according to an embodiment of the present invention.

FIGS. 19 and 20 are simplified diagrams showing the DRAM process after the formation of the MISFETs (Qt, Qn, and Qp). FIG. 19 shows a state where bit lines BL and first layer wirings 30 to 33 of the peripheral circuit are formed over the MISFETs (Qt, Qn, and Qp) via insulating films 20 and 21. The bit line BL and the first layer wirings 30 to 33 are formed by the patterning of the W film deposited on the insulating film 21. FIG. 20 shows a state where the data storage capacitor C of the memory cell is formed over the bit line BL. The data storage capacitor C is formed in the following manner. That is, after forming a trench 47 in a thick interlayer insulating film 46 on the bit line BL, a lower electrode 48 made of a polycrystalline silicon film, a capacitor insulating film 49 made of a tantalum oxide film, and an upper electrode 50 made of a TiN (titanium nitride) film are laminated in the trench 47.

Second Embodiment

Figure 21:
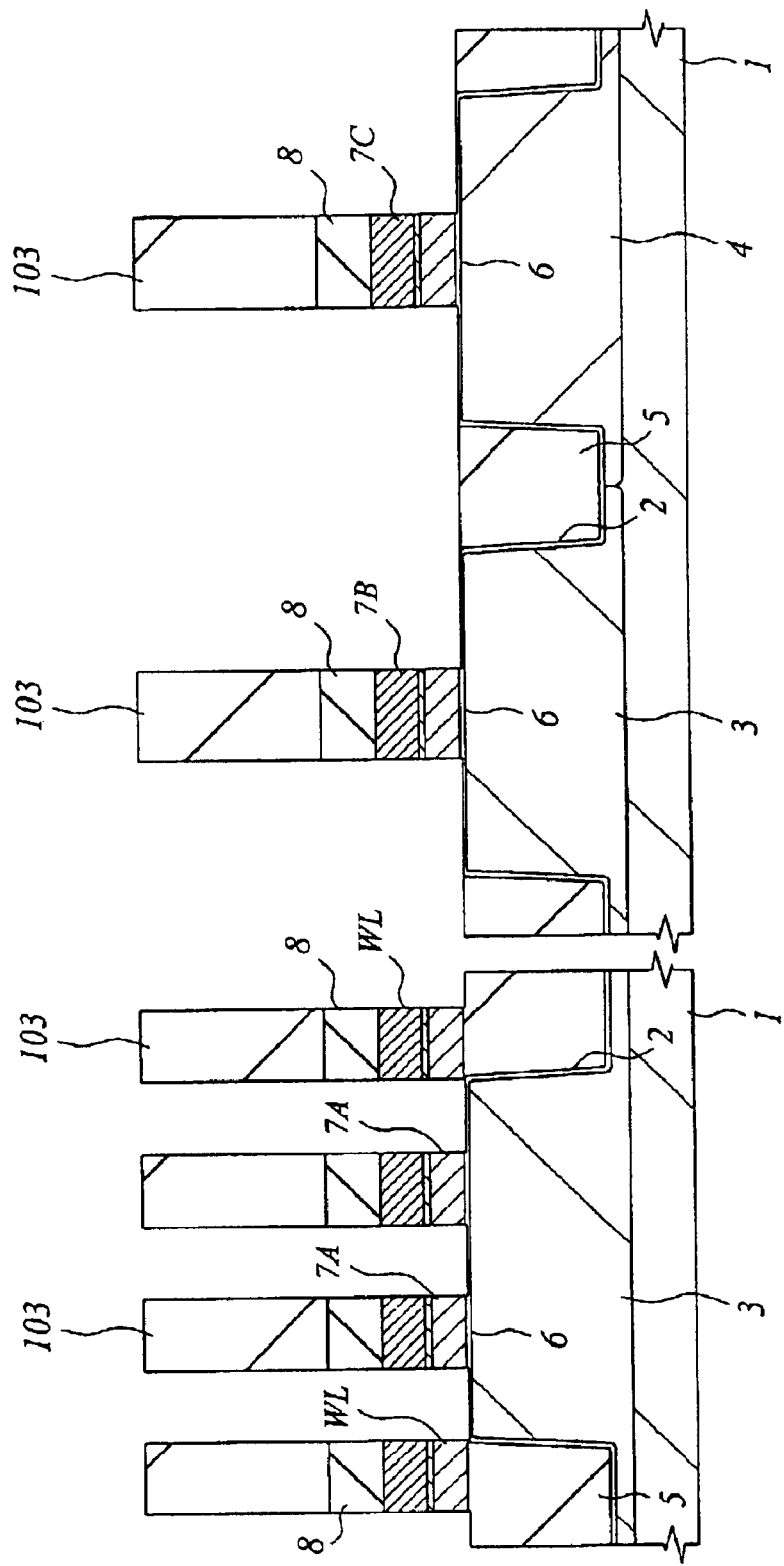
FIG. 21 is a sectional view showing the principal part of a semiconductor substrate that illustrates the manufacturing method of the DRAM according to another embodiment of the present invention.

The manufacturing method of a DRAM according to the second embodiment will be described with reference to FIGS. 21 to 25. First, as shown in FIG. 21, gate electrode materials and a silicon nitride film 8 are deposited over the substrate 1, and then, the silicon nitride film 8 and the gate electrode materials are dry-etched with using the photoresist film 103 as a mask. By so doing, the gate electrode 7A is formed in the memory array region and the gate electrodes 7B and 7C are formed in the peripheral circuit region. The steps until then are identical to those in the first embodiment show in FIGS. 1 to 9.

Figure 22:
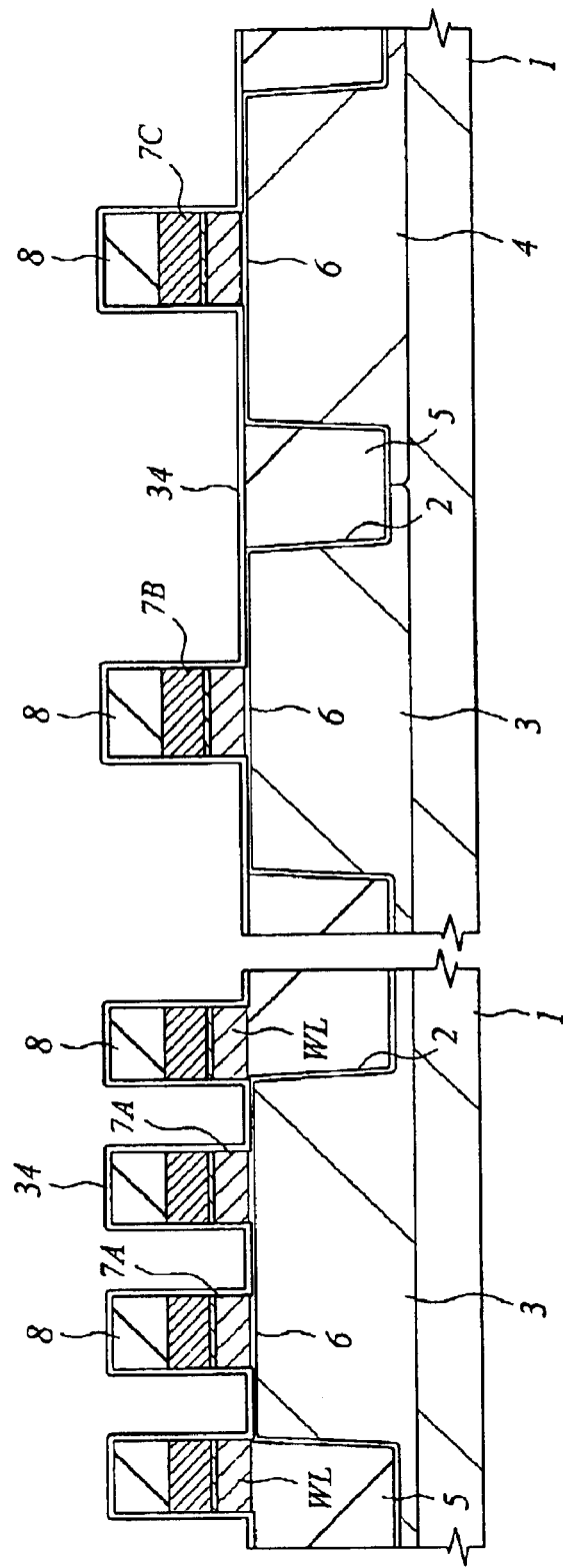
FIG. 22 is a sectional view showing the principal part of a semiconductor substrate that illustrates the manufacturing method of the DRAM according to another embodiment of the present invention.
Figure 23:
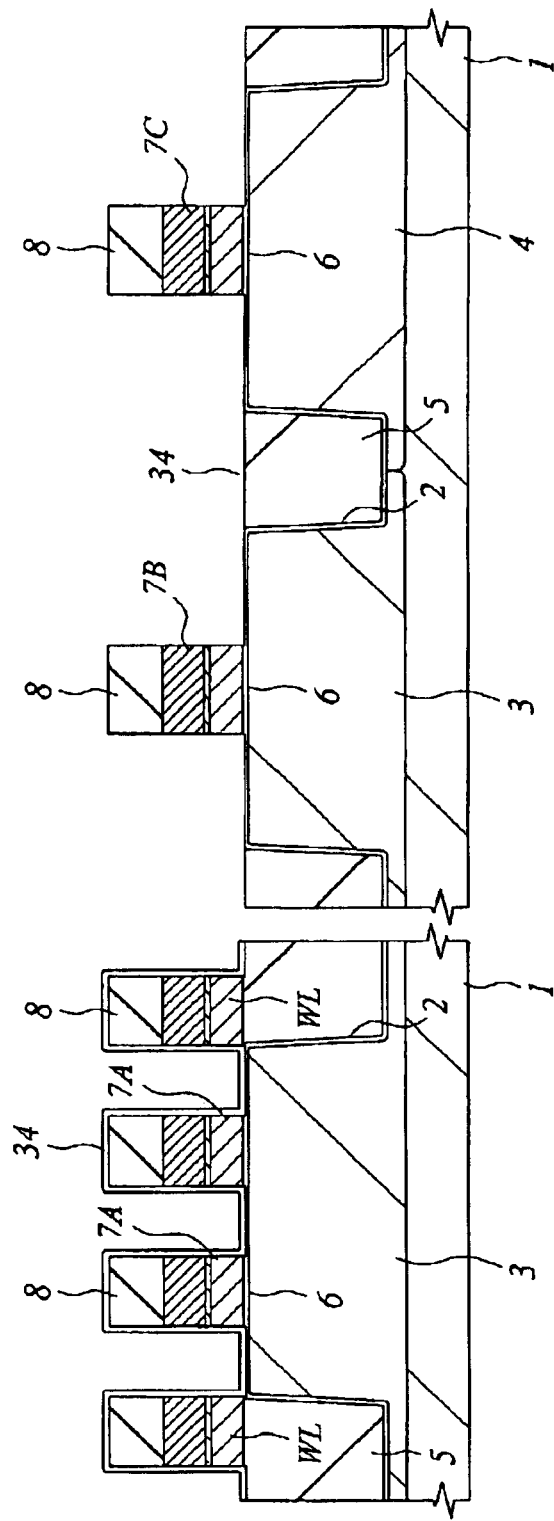
FIG. 23 is a sectional view showing the principal part of a semiconductor substrate that illustrates the manufacturing method of the DRAM according to another embodiment of the present invention.

Next, after the removal of the photoresist film 103, the re-oxidation process is performed in the first embodiment. However, in the second embodiment, a silicon oxide film 34 is deposited over the substrate 1 by the CVD method as shown in FIG. 22. Subsequently, as shown in FIG. 23, the memory array region is covered with a photoresist film (not shown) and the silicon oxide film 34 in the peripheral circuit region is removed by the etching, thereby leaving the silicon oxide film 34 only in the memory array region.

Figure 24:
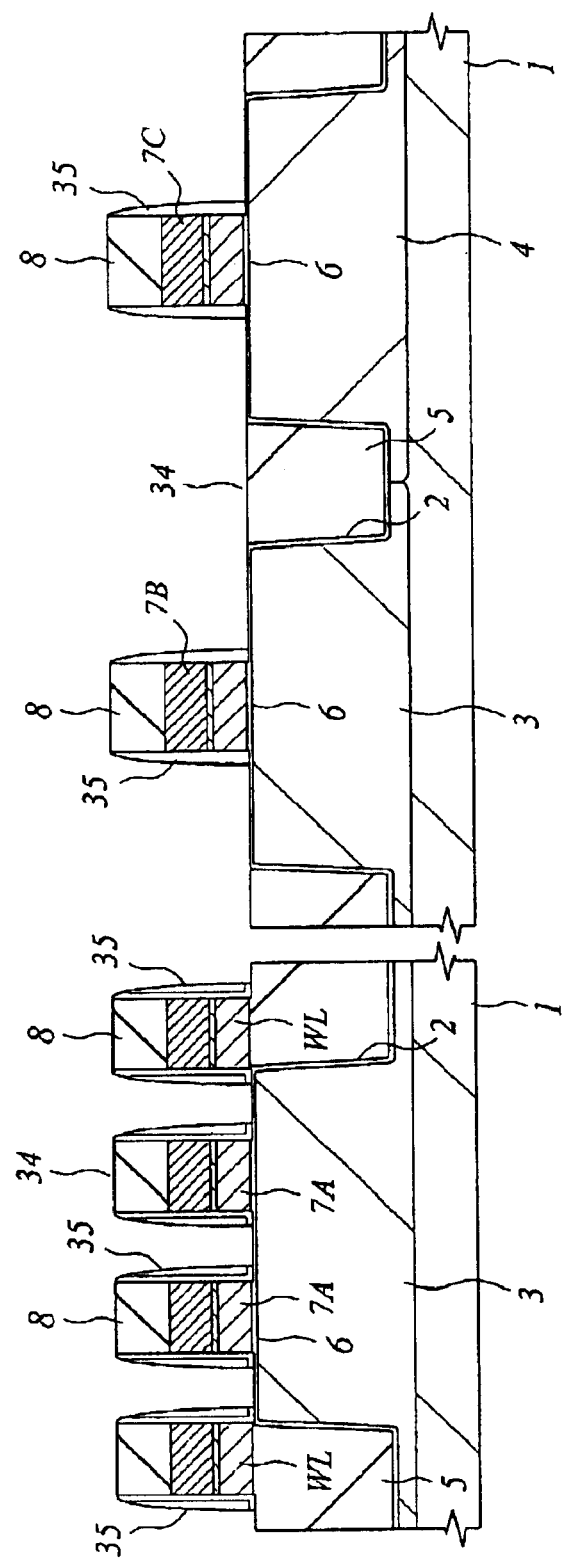
FIG. 24 is a sectional view showing the principal part of a semiconductor substrate that illustrates the manufacturing method of the DRAM according to another embodiment of the present invention.

Next, as shown in FIG. 24, sidewall spacers 35 are formed on the sidewalls of the gate electrodes 7A, 7B, and 7C by the anisotropic etching of the silicon nitride film deposited over the substrate 1 by the CVD method. As shown in the enlarged view in FIG. 25, when the sidewall spacers 35 is formed, one end of the silicon oxide film 34 deposited by the CVD method is exposed at the lower edge portion of the sidewall of the gate electrode 7A formed in the memory array region. Meanwhile, since the silicon oxide film 34 in the peripheral circuit region is removed in advance, the sidewalls of the gate electrodes 7B and 7C including their lower edge portions are covered with the sidewall spacers made of a silicon nitride film.

In this state, the re-oxidation process is performed. The re-oxidation process is performed under the same conditions as those in the first embodiment. As described above, one end of the silicon oxide film 34 deposited by the CVD method is exposed at the lower edge portion of the sidewall of the gate electrode 7A formed in the memory array region. In general, there are more voids created in the silicon oxide film deposited by the CVD method in comparison to the silicon oxide film formed by the thermal oxidation process, and the silicon oxide film deposited by the CVD method is less dense than the silicon oxide film formed by the thermal oxidation process. Therefore, when the re-oxidation process is performed, the oxide seed contained in the atmosphere penetrates into the center of the gate electrode 7A through one end of the silicon oxide film 34 exposed at the lower edge portion of the sidewall of the gate electrode 7A as shown in FIG. 26. Thus, when the gate insulating film 6' with large thickness is formed below the sidewall of the gate electrode 7A, the bird's beak thereof reaches the center of the gate electrode 7A, and the gate insulating film 6a with large thickness is formed just below the center of the gate electrode 7A.

Meanwhile, since the sidewalls of the gate electrodes 7B and 7C formed in the peripheral circuit region are covered with the sidewall spacers 35 made of a silicon nitride film more dense than the silicon oxide film, the oxide seed contained in the atmosphere is scarcely penetrated into the lower portion of the gate electrodes 7B and 7C. Therefore, even in the case where the gate insulating film 6' with large thickness is formed in the periphery of the gate electrodes 7B and 7C, the bird's beak thereof does not reach the center of the gate electrodes 7B and 7C. Therefore, the thickness of the gate insulating film 6 just below the center of the gate electrodes 7B and 7C is almost the same as that before the re-oxidation process.

As described above, according to the second embodiment, it is possible to perform the two-level gate insulator process in the manufacture of the DRAM without increasing the number of photomasks. Therefore, it is possible to prevent the increase of the manufacturing cost due to the introduction of the two-level gate insulator process.

With the further scaling of the DRAM, not only the gate length of the gate electrode 7A formed in the memory array region but also the gate length of the gate electrodes 7B and 7C formed in the peripheral circuit region is much reduced. In this case, since the thickness of the gate insulating film just below the center of the gate electrodes 7B and 7C is also increased when the re-oxidation process is performed, the method according to the first embodiment is not suitable to realize the two-level gate insulator process. On the other hand, the method according to the second embodiment can realize the two-level gate insulator process regardless of the gate length of the gate electrodes 7A, 7B, and 7C.

In the foregoing, the invention made by the inventors of the present invention has been concretely described based on the embodiments. However, it is needless to say that the present invention is not limited to the foregoing embodiments and various modifications and alterations can be made within the scope of the present invention.

In the foregoing embodiments, the case where the gate insulating film is formed of a silicon oxide film has been described. However, the gate insulating film is not limited to this, and it is also possible to apply the present invention to the case where the gate insulating film is made of a partially nitrided silicon oxide film or a laminated film of a silicon oxide film and other high dielectric film.

In the foregoing embodiments, the DRAM in which the thickness of the gate insulating films in all of the MISFETs that constitute the peripheral circuit is uniform has been described. However, it is also possible to apply the present invention to the DRAM in which the MISFETs that constitute the peripheral circuit are composed of MISFETs having thin gate insulating films and MISFETs having thick gate insulating films. In the case where the present invention is applied to such a DRAM, the thickness of the gate insulating film formed just below the center of the gate electrode that constitutes the memory cell becomes larger than the thickness of the gate insulating film formed just below the center of the gate electrode of the MISFET of the peripheral circuit having the thin gate insulating film, and also, it becomes larger than the thickness of the gate insulating film formed just below the center of the gate electrode of the MISFET of the peripheral circuit having a thick gate insulating film.

It is possible to apply the present invention to the DRAM-logic embedded LSI in addition to the general purpose DRAM.

The advantages achieved by the typical ones of the inventions disclosed in this application will be briefly described as follows.

Since it is possible to realize the two-level gate insulator process in the manufacture of the DRAM without increasing the number of manufacturing steps and photomasks, it is possible to improve the performance of the DRAM without increasing the manufacturing cost thereof.

What is claimed is:

1. A method of manufacturing a semiconductor integrated circuit device, comprising the steps of:
    (a) forming a gate insulating film in first and second regions of a main surface of a semiconductor substrate;
    (b) forming a conductive film on the gate insulating film;
    (c) etching the conductive film to form a first gate electrode on the gate insulating film in the first region and a second gate electrode on the gate insulating film in the second region, the second gate electrode having a gate length longer than that of the first gate electrode;
    (d) performing thermal treatment to the semiconductor substrate to make the gate insulating film formed just below the center of the first gate electrodes thicker than the gate insulating film formed just below the center of the second gate electrode; and
    (e) after the step (d), forming a first MISFET having the first gate electrode in the first region and forming a second MISFET having the second electrode in the second region.

2. The method of manufacturing a semiconductor integrated circuit device according to claim 1,
    wherein the first MISFET is a MISFET which constitutes a memory cell of a DRAM and the second MISFET is a MISFET which constitutes a peripheral circuit of the DRAM.

3. The method of manufacturing a semiconductor integrated circuit device according to claim 1,
    wherein the first and second gate electrodes have a laminate structure of a silicon film and a metal film.

4. The method of manufacturing a semiconductor integrated circuit device according to claim 3,
    wherein the thermal treatment in the step (d) is performed in a reducing atmosphere of mixed gas containing hydrogen and water vapor so that silicon is oxidized but the metal film is not oxidized.

5. A method of manufacturing a semiconductor integrated circuit device, comprising the steps of:
    (a) forming a gate insulating film in first and second regions of a main surface of a semiconductor substrate;
    (b) forming a conductive film on the gate insulating film;
    (c) etching the conductive film to form a first gate electrode on the gate insulating film in the first region and a second gate electrode on the gate insulating film in the second region;
    (d) after the step (c), forming a silicon oxide film over the semiconductor substrate by the CVD method and then removing the silicon oxide film in the second region;

(e) after the step (d); forming a silicon nitride film over the semiconductor substrate by the CVD method and then etching the silicon nitride film and the silicon oxide film in the first region, thereby forming a first sidewall spacer formed of a laminated film of the silicon oxide film and the silicon nitride film on a sidewall of the first gate electrode and forming a second sidewall spacer formed of the silicon nitride film on a sidewall of the second gate electrode;

(f) after the step (e), performing thermal treatment to the semiconductor substrate to make the gate insulating film formed just below the center of the first gate electrode thicker than the gate insulating film formed just below the center of the second gate electrode; and (g) after the step (f), forming a first MISFET having the first gate electrode in the first region and forming a second MISFET having the second gate electrode in the second region.

6. The method of manufacturing a semiconductor integrated circuit device according to claim 5, wherein the first MISFET is a MISFET which constitutes a memory cell of a DRAM and the second MISFET is a MISFET which constitutes a peripheral circuit of the DRAM.

7. The method of manufacturing a semiconductor integrated circuit device according to claim 5, wherein the first and second gate electrodes have a laminate structure of a silicon film and a metal film.

* * * * *